(12) United States Patent
Hirai

(10) Patent No.: US 7,678,697 B2
(45) Date of Patent: Mar. 16, 2010

(54) SUBSTRATE, DEVICE, METHOD OF MANUFACTURING DEVICE, METHOD OF MANUFACTURING ACTIVE MATRIX SUBSTRATE, ELECTRO-OPTICAL APPARATUS AND ELECTRONIC APPARATUS

(75) Inventor: Toshimitsu Hirai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 262 days.

(21) Appl. No.: 12/005,627

(22) Filed: Dec. 28, 2007

(65) Prior Publication Data

US 2008/0132009 A1 Jun. 5, 2008

Related U.S. Application Data

(62) Division of application No. 10/836,205, filed on May 3, 2004, now abandoned.

(30) Foreign Application Priority Data

| May 9, 2003 | (JP) | ............................. 2003-131600 |
| May 9, 2003 | (JP) | ............................. 2003-131601 |
| Apr. 9, 2004 | (JP) | ............................. 2004-115371 |

(51) Int. Cl.
    *H01L 21/44* (2006.01)
(52) U.S. Cl. ................ 438/674; 438/660; 257/E21.002
(58) Field of Classification Search ................ 438/660, 438/674, 677; 257/E21.002
    See application file for complete search history.

(56) References Cited

U.S. PATENT DOCUMENTS

| 5,726,724 A | 3/1998 | Shirota et al. |
| 5,817,441 A | 10/1998 | Iwata et al. |
| 5,948,577 A | 9/1999 | Nakazawa et al. |
| 5,989,945 A | 11/1999 | Yudasaka et al. |
| 6,476,988 B1 | 11/2002 | Yudasaka |
| 6,522,373 B1 | 2/2003 | Hira et al. |
| 6,593,591 B2 | 7/2003 | Yudasaka et al. |
| 6,599,582 B2 | 7/2003 | Kiguchi et al. |
| 6,630,274 B1 | 10/2003 | Kiguchi et al. |
| 6,755,983 B2 | 6/2004 | Yudasaka |
| 6,810,814 B2 | 11/2004 | Hasei |
| 6,815,125 B1 | 11/2004 | Okabe et al. |
| 6,861,279 B2 | 3/2005 | Nakanishi et al. |
| 6,967,352 B2 | 11/2005 | Yudasaka |
| 7,015,503 B2 | 3/2006 | Seki et al. |
| 7,061,570 B2 | 6/2006 | Imai |
| 7,067,337 B2 | 6/2006 | Yudasaka et al. |
| 7,129,166 B2 * | 10/2006 | Speakman .................. 438/674 |
| 7,182,815 B2 | 2/2007 | Katagami et al. |
| 7,229,859 B2 | 6/2007 | Yudasaka et al. |

(Continued)

FOREIGN PATENT DOCUMENTS

JP    A 9-203803    8/1997

(Continued)

*Primary Examiner*—Zandra Smith
*Assistant Examiner*—Christy L Novacek
(74) *Attorney, Agent, or Firm*—Oliff & Berridge, PLC

(57) ABSTRACT

A substrate on which a pattern is formed by a discharged functional liquid, includes a coating region coated with the functional liquid, and banks formed to enclose the coating region, wherein a difference between a contact angle of the functional liquid with respect to the coating region and a contact angle of the functional liquid with respect to the bank is above 40°.

9 Claims, 13 Drawing Sheets

U.S. PATENT DOCUMENTS

| | | | |
|---|---|---|---|
| 2002/0014470 | A1 | 2/2002 | Okada et al. |
| 2002/0074547 | A1 | 6/2002 | Yudasaka et al. |
| 2003/0083203 | A1 | 5/2003 | Hashimoto et al. |
| 2004/0201048 | A1 | 10/2004 | Seki et al. |
| 2005/0001879 | A1 | 1/2005 | Miyajima et al. |
| 2005/0186403 | A1 | 8/2005 | Seki et al. |
| 2005/0191781 | A1 | 9/2005 | Hirai |
| 2006/0084206 | A1 | 4/2006 | Moriya et al. |
| 2006/0146379 | A1 | 7/2006 | Katagami et al. |
| 2007/0020899 | A1 | 1/2007 | Hirai et al. |

FOREIGN PATENT DOCUMENTS

| | | |
|---|---|---|
| JP | A 9-230129 | 9/1997 |
| JP | A 11-204529 | 7/1999 |
| JP | A 11-274671 | 10/1999 |
| JP | A 2000-216330 | 8/2000 |
| JP | A 2000-353594 | 12/2000 |
| JP | A 2002-164635 | 6/2002 |
| JP | A-2002-273869 | 9/2002 |
| JP | A 2003-058077 | 2/2003 |
| JP | A 2003-059940 | 2/2003 |
| JP | A 2003-124210 | 4/2003 |
| JP | A 2003-124215 | 4/2003 |
| WO | WO 97/43689 A1 | 11/1997 |
| WO | WO 02/059985 A1 | 8/2002 |

* cited by examiner

SUBSTRATE, DEVICE, METHOD OF MANUFACTURING DEVICE, METHOD OF MANUFACTURING ACTIVE MATRIX SUBSTRATE, ELECTRO-OPTICAL APPARATUS AND ELECTRONIC APPARATUS

This is a Divisional Application of application Ser. No. 10/836,205, filed May 3, 2004. The entire disclosure of the prior application is hereby incorporated by reference herein in its entirety.

BACKGROUND OF THE INVENTION

1. Field of the Invention

The present invention relates to a substrate for thin film patterning, a device, a method of manufacturing a device, a method of manufacturing an active matrix substrate, and an electro-optical apparatus and electronic apparatus.

Priority is claimed on Japanese Patent Applications No. 2003-131600, filed May 9, 2003, No. 2003-131601, filed May 9, 2003, and No. 2004-115371, filed Apr. 9, 2004, the contents of which are incorporated herein by reference.

2. Description of Related Art

Conventionally, as a method of manufacturing a fine wiring pattern such as a semiconductor integrated circuit, a photolithography method has been widely used. On the other hand, for example, in Japanese Unexamined Patent Application, First Publication No. H11-274671 or in Japanese Unexamined Patent Application, First Publication No. 2000-216330, methods of using a droplet discharge method have been disclosed. In the technique disclosed in these publications, a functional liquid containing a pattern forming material is discharged from a droplet discharge head onto a substrate so that the material is arranged (coated) on the pattern forming surface to form a wiring pattern. This technique is considered to be very effective since it can correspond to manufacture of small quantities and large varieties.

Incidentally, densification of circuits for configuring devices has recently been advancing, and for example, for the wiring pattern there has been a demand for these to be miniaturized and made thinner.

However, in the case where an attempt is made to form such fine wiring patterns by the aforementioned droplet discharge method, it is particularly difficult to make the width of the wiring sufficiently accurate. Therefore, for example, in Japanese Unexamined Patent Application, First Publication No. H09-203803 or in Japanese Unexamined Patent Application, First Publication No. H09-230129, a technique of providing banks being partitioning members, on the substrate and performing surface treatment so as to make the top of the banks repellent and the other portions attraction, has been described.

By using this technique, even if it is a thin line, the width of the wiring pattern may be defined by the width between the banks. Moreover, even if the discharged droplet is partially placed on the banks, it is repelled by the repellent banks and flows into the attraction section being a ditch between the banks.

On the other hand, the banks are formed using the photolithography method, which may increase the cost. Therefore, a method has been proposed where, on a attraction section of a substrate previously formed with a pattern of repellent sections and attraction sections, a liquid material (functional liquid) is selectively discharged by the droplet discharge method. In this case, a liquid material dispersed with conductive particles easily stays on the attraction section. Therefore, it becomes possible to form the wiring pattern without forming banks but still maintaining the position accuracy.

However, the conventional techniques have the following problems.

In the case where the difference in the wettability (affinity) with respect to the droplet between the repellent sections and the attraction section is small, there is a possibility in that, although the droplet placed on the banks is repelled, it may not become wet to spread out into the ditch.

Moreover, in the case where the diameter of droplet is larger than the diameter of the ditch, there is concern that the droplet may remain as is, landed on the ditch.

On the other hand, even if a substrate patterned with the repellent sections and the attraction section is used, in the case where the difference in the wettability (affinity) with respect to the droplet between the repellent sections and the attraction section is small, there is a possibility that, although the droplet placed on the repellent sections is repelled, it may not become wet to spread out into the attraction section.

The present invention takes the above problems into consideration with the object of providing a substrate for thin film patterning, a device, a method of manufacturing a device, a method of manufacturing an active matrix substrate, and an electro-optical apparatus and electronic apparatus, in which a landed droplet can reliably get wet to spread out into a ditch so as to form a thin line.

Another object of the present invention is to provide a substrate for thin film patterning, a device, a method of manufacturing a device, a method of manufacturing an active matrix substrate, and an electro-optical apparatus and electronic apparatus, in which a landed droplet can reliably get wet to spread out into the attraction section so as to form a thin line, even if a substrate patterned with the repellent sections and the attraction section is used.

SUMMARY OF THE INVENTION

In order to achieve the abovementioned object, the following construction is employed in the present invention.

The first aspect of the present invention is a substrate on which a pattern is formed by a discharged functional liquid, having a coating region coated with the functional liquid, and banks formed to enclose the coating region, wherein a difference between a contact angle of the functional liquid with respect to the coating region and a contact angle of the functional liquid with respect to the bank is above 40°.

Therefore, in the present invention, even in the case where the discharged functional liquid is partially placed on the top of the banks, the functional liquid can reliably go into the coating region between the banks due to the fluidity of the functional liquid or the capillary phenomenon, enabling a fine linear pattern defined by the width between the banks to be obtained. Moreover, the contact angle of the functional liquid with respect to the coating region is preferably below 15°. In this case the functional liquid of the coating region becomes wet to spread out on the substrate more easily so that the functional liquid can be filled into the coating region more evenly. Therefore, the functional liquid discharged at intervals can be integrated without being segmented in the coating region, which enables prevention of defects such as disconnection.

As a method of increasing the contact angle with respect to the banks, a construction may be employed in which the surface is reformed by a plasma treatment, or the banks are made to contain fluorine or a fluorine component. If plasma treatment is performed, the repellency may be controlled by adjusting the treatment time.

The second aspect of the present invention is a substrate with a surface on which a pattern is formed by a discharged functional liquid, having a coating region to be coated with the functional liquid, and a repellent region formed by repellent film enclosing the coating region. A difference between a contact angle of the functional liquid with respect to the coating region and a contact angle of the functional liquid with respect to the repellent region is above 40°.

Therefore, on the substrate of the present invention, even in the case where the discharged functional liquid is partially placed on the top of the repellent region, the functional liquid can reliably go into the coating region between the repellent region due to the difference in affinity or the fluidity of the functional liquid, enabling to obtain a fine linear pattern defined by the width of the coating region to be obtained. Moreover, the contact angle of the functional liquid with respect to the coating region is preferably below 15°. In this case the functional liquid of the coating region becomes wet to spread out on the substrate more easily so that the functional liquid can be filled into the coating region more evenly. Therefore, the functional liquid discharged at intervals can be integrated without being segmented in the coating region, which enables prevention of defects such as disconnection.

In the present invention, for the repellent film, a configuration may be suitably employed in which a repellent monomolecular film is formed on the surface. A self organizing film composed of organic molecules is preferable for the repellent monomolecular film. In this case, the monomolecular film may be easily formed.

The coating region is preferably imparted with an attractive property. In this case a method of irradiating ultraviolet light or a method of exposing the substrate in an ozone atmosphere may be suitably employed. In this case, the repellent film which was once formed, can be partially broken down thoroughly and evenly by using a mask corresponding to the pattern, enabling a lessening of the repellency so that a desired attraction can be evenly obtained.

On the other hand, the third aspect of the present invention is a device comprising a substrate on which a pattern is formed, wherein a functional liquid is discharged onto the abovementioned substrate so as to form the pattern.

Therefore, in the present invention, by using the substrate on which a thin linear pattern is patterned, it becomes possible to realize a small and thin device.

Moreover, in the case where the functional liquid contains conductive particles, it becomes possible to realize a device on which a thin linear pattern is patterned.

The fourth aspect of the present invention is an electro-optical apparatus having the abovementioned device.

The fifth aspect of the present invention is electronic apparatus having the abovementioned electro-optical apparatus.

Therefore, it becomes possible to obtain an electro-optical apparatus and electronic equipment of small size and thickness, in which defects such as disconnection rarely occur.

The sixth aspect of the present invention is a method of manufacturing a device in which a functional liquid is discharged onto the substrate so as to form the pattern.

Furthermore, the seventh aspect of the present invention is a method of manufacturing an active matrix substrate having a first step for forming a gate wiring on the substrate, a second step for forming a gate insulating film on the gate wiring, a third step for laminating a semiconductor layer via the gate insulating film, a fourth step for forming a source electrode and a drain electrode on the gate insulating layer, a fifth step for arranging an insulating material on the source electrode and the drain electrode, and a sixth step for forming a pixel electrode on the arranged insulating material, and any one of the first step, the fourth step and the sixth step includes a step for discharging a functional liquid onto the substrate.

According to the present invention, it becomes possible to obtain a thin type active matrix substrate on which a thin linear pattern is formed, and in which quality defects such as disconnection in the gate wiring, source electrodes, drain electrodes, and pixel electrodes rarely occur.

DETAILED DESCRIPTION OF THE INVENTION

Figure 1:
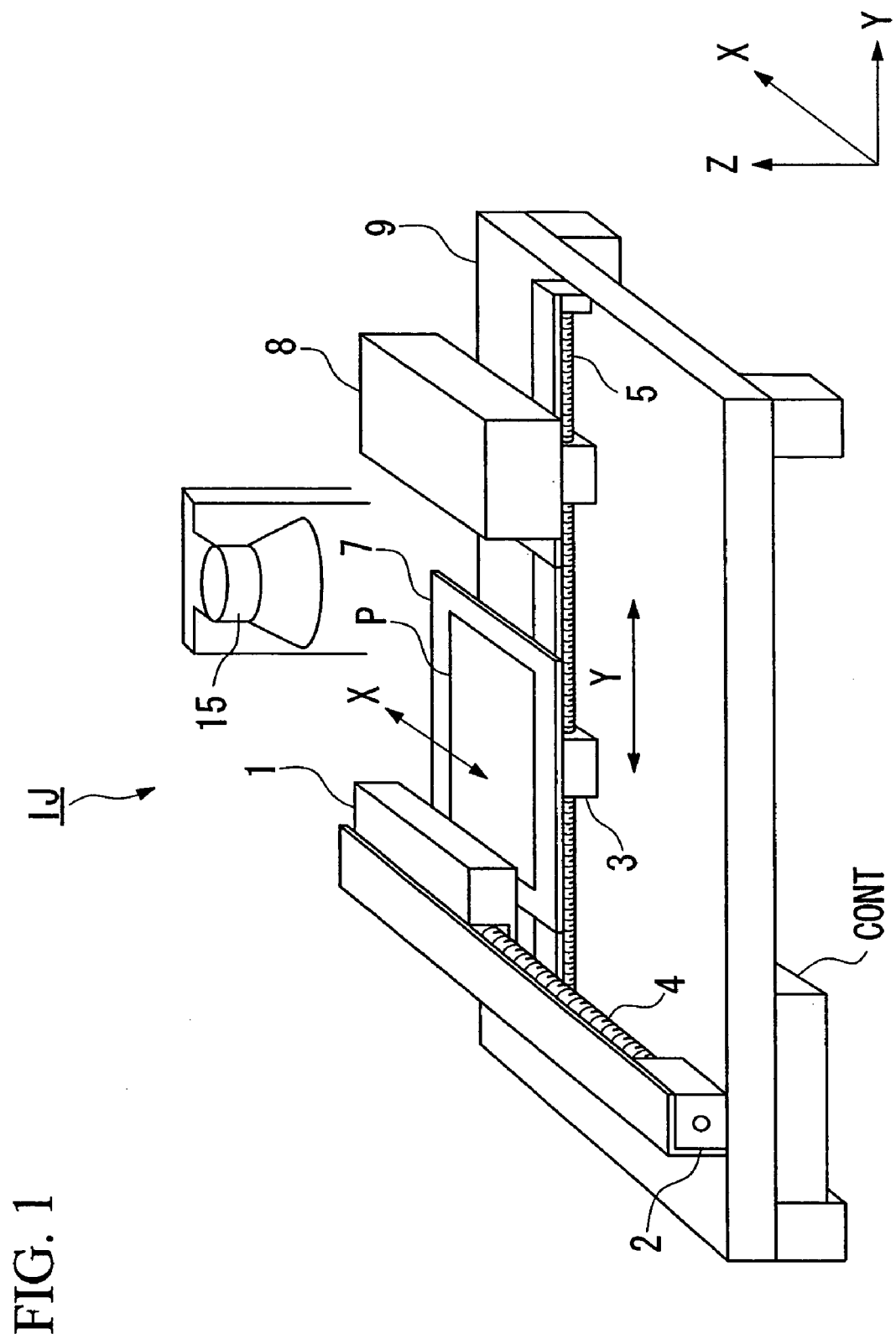
FIG. 1 is a schematic perspective view of a droplet discharge apparatus.

Hereunder is a description of embodiments of a substrate, a device, a method of manufacturing a device, a method of manufacturing an active matrix substrate, and an electro-optical apparatus and electronic apparatus of the present invention, with reference of the drawings.

First Embodiment

The present embodiment is described using an example of a case where a wiring pattern (pattern) ink including conductive particles (functional liquid), is discharged from a nozzle of a liquid discharge head in droplet form by the droplet discharge method so as to form a wiring pattern formed from a conductive film on a substrate.

This wiring pattern ink is composed of a dispersing liquid being a dispersion medium with conductive particles dispersed therein, or a solution being a solvent (dispersion medium) with organosilver compounds or silver oxide nano-particles dispersed therein.

In the present embodiment, for the conductive particles, for example, metal particles which contain gold, silver, copper, palladium, or nickel, and oxidized substances thereof, organosilver compound, a conductive polymer or superconductive particles are used.

To increase the dispersibility of these conductive particles, organic matter may be coated on the surface for use.

The diameter of the conductive particles is preferably above 1 nm and below 0.1 μm. If it is larger than 0.1 μm, there is concern of clogging at the nozzle of a liquid discharge head described later. If it is smaller than 1 nm, the volume ratio of coating with respect to conductive particles is increased, causing an excessive ratio of organic matter in the film to be obtained.

The dispersion medium is not particularly restricted provided it can disperse the abovementioned conductive particles therein without condensation. For example, the examples include, in addition to water, alcohol such as methanol, ethanol, propanol and butanol, hydrocarbon compounds such as n-heptane, n-octane, decane, decane, dodecane, tetradecane, toluene, xylene, cymene, dulene, indent, dipentene, tetrahydronaphthalene, decahydronaphthalene and cyclohexylbenzene, ether compounds such as ethyleneglycoldimethyl ether, ethyleneglycoldiethyl ether, ethyleneglycolmethylethyl ether, diethyleneglycoldimethyl ether, diethylenglycoldiethyl ether, diethyleneglycolmethylethyl ether, 1,2-dimethoxyethane, bis(2-methoxyethyl)ether, and p-dioxane, and polar compounds such as propylene carbonate, γ-butyrolactone, N-methyl-2-pyrolidone, dimethylformamide, dimethylsulfoxide and cyclohexanone. Among these, water, alcohol, hydrocarbon compounds and ether compounds are preferable in terms of the dispersibility of particles, stability of dispersion liquid, and easy application to the droplet discharge method (inkjet method), where water and hydrocarbon solvents are especially preferable as a dispersion medium.

It is preferable that the surface tension of the dispersing liquid of the abovementioned conductive particles be in the range above 0.02 N/m and below 0.07 N/m. This is because when liquid is discharged using the inkjet method, if the surface tension is less than 0.02 N/m, the wettability of the ink composition with respect to the nozzle surface increases so that the discharge direction tends to deviate, and if the surface tension exceeds 0.07 N/m, the shape of the meniscus at the tip of the nozzle becomes unstable, making it difficult to control the discharge amount and the discharge timing. In order to modify the surface tension, a good way is to add a small amount of surface tension modifier such as a fluorine group, silicon group, nonionic group, into the abovementioned dispersing liquid to an extent not to largely decrease the contact angle with the substrate. The nonionic surface tension modifier increases the wettability of liquid on the substrate, improves the leveling property of the film, and helps to prevent the occurrence of minute ruggedness on the film. The abovementioned surface tension modifier may contain organic compounds such as alcohol, ether, ester, ketone, and the like as required.

The viscosity of the abovementioned dispersing liquid is preferably above 1 mPa·s and below 50 mPa·s. This is because when liquid material is discharged in droplet form using the inkjet method, if the viscosity is smaller than 1 mPa·s, the area around the nozzle is easily contaminated by discharged ink, and if the viscosity is higher than 50 mPa·s, the frequency of clogging at the nozzle hole increases, making it difficult to smoothly discharge droplets.

For the substrate on which a wiring pattern is formed, various types of plates such as a glass, a fused silica, a Si wafer, a plastic film, a metal plate, or the like may be used. Moreover, the examples also include substrates of such various materials formed with a semiconductor film, a metal film, a dielectric film, an organic film as a ground layer on the surface.

Here, discharging techniques of the droplet discharge method include an electrification controlling method, a pressing and vibrating method, an electromechanical converting method, an electro-thermal converting method, an electrostatic attracting method, and the like. In the electrification controlling method, an electric charge is applied to a material by an electrification electrode and the discharge direction of the material is controlled by a deflecting electrode to discharge from the nozzle. Moreover, in the pressing and vibrating method, a super-high pressure of about 30 kg/cm$^2$ is applied to a material to discharge the material from the tip of the nozzle. If a control voltage is not applied, the material goes straight and is discharged from the nozzle. If the control voltage is applied, due to an electrostatic repulsion generated between the materials, the materials are dispersed and are not discharged from the nozzle. In the electrothermal converting method, the property where a piezo device (piezoelectric element) deforms on receiving a pulsed electric signal is used, and due to the deformation of the piezo device, a pressure is applied to a space storing a material, through a flexible substance so as to push the material out of this space and discharge it from the nozzle.

Furthermore, in the electrothermal converting method, the material is rapidly gasified so as to generate bubbles by a heater provided in a space storing the material, so that the material in the space is discharged by the pressure of the bubbles. In the electrostatic attracting method, a micropressure is applied into a space storing the material and a meniscus of the material is formed in the nozzle, in which state an electrostatic attractive force is applied so as to draw the material out. In addition to these methods, such techniques as a method of using a viscosity variation of a fluid due to an electric field, and a method of blowing the material out by an electric discharge spark, are also applicable. The advantage of the droplet discharge method is that waste of the material in use is less, and the desired amount of material can be surely arranged in the desired position. The amount of one drop of liquid material (fluid body) discharged by the droplet discharge method is for example 1 to 300 ng (nanogram).

Next is a description of a device manufacturing apparatus used when manufacturing a device, according to the present invention.

For this device manufacturing apparatus, a droplet discharge apparatus (inkjet device) which manufactures the device by discharging droplets from a droplet discharge head to a substrate, is used.

FIG. 1 is a perspective view showing a schematic configuration of a droplet discharge apparatus IJ.

The droplet discharge apparatus IJ includes; a droplet discharge head 1, a X direction driving shaft 4, a Y direction guide shaft 5, a controller CONT, a stage 7, a cleaning mechanism 8, a base 9, and a heater 15.

The stage 7 is for supporting a substrate P on which an ink (liquid material) is provided by this droplet discharge apparatus IJ, and includes a fixing mechanism (not shown) which fixes the substrate P at a reference position.

The droplet discharge head 1 is a multi-nozzle type droplet discharge head equipped with a plurality of discharge nozzles having a longitudinal direction matching the X axis direction. The plurality of discharge nozzles are provided and arranged in constant intervals in the Y axis direction on the lower surface of the droplet discharge head 1. An ink containing the abovementioned conductive particles is discharged from the discharge nozzles of the droplet discharge head 1 onto the substrate P supported by the stage 7.

To the X direction driving shaft 4, an X direction driving motor 2 is connected. The X direction driving motor 2 is a stepping motor or the like, which rotates the X direction driving shaft 4 when a driving signal for the X axis direction is supplied from the controller CONT. When the X direction driving shaft 4 rotates, the droplet discharge head 1 moves in the X axis direction.

The Y direction guide shaft 5 is fixed so as to not move relative to the base 9. The stage 7 includes a Y direction driving motor 3. The Y direction driving motor 3 is a stepping motor or the like, which moves the stage 7 in the Y axis direction when a Y axis direction driving signal is supplied from the controller CONT.

The controller CONT supplies a voltage for droplet discharge control to the droplet discharge head 1. The controller CONT also supplies a driving pulse signal which controls the movement of the droplet discharge head 1 in the X axis direction, to the X direction driving motor 2, and supplies a driving pulse signal which controls the stage 7 in the Y axis direction, to the Y direction driving motor 3.

The cleaning mechanism 8 is for cleaning the droplet discharge head 1. The cleaning mechanism 8 includes a Y direction driving motor (not shown). By the driving of this Y direction driving motor, the cleaning mechanism moves along the Y direction guide shaft 5. The movement of the cleaning mechanism 8 is also controlled by the controller CONT.

The heater 15 is here a device for heat treatment of the substrate P by lamp annealing, which evaporates and dries the solvent included in a liquid material coated on the substrate P. Power ON/OFF of this heater 15 is also controlled by the controller CONT.

The droplet discharge apparatus IJ discharges droplets onto the substrate P while relatively scanning the stage 7 supporting the droplet discharge head 1 and the substrate P. Here, in the description hereunder, the arrangement is such that the X axis direction is the scanning direction and the Y axis direction orthogonal to the X axis direction is the non-scanning direction. Therefore, the discharge nozzles of the droplet discharge head 1 are provided and arranged in constant intervals in the Y axis direction which is the non-scanning direction. In FIG. 1, the droplet discharge head 1 is arranged at a right angle with respect to the running direction of the substrate P. However, the arrangement may be such that the angle of the droplet discharge head 1 is adjusted to cross with respect to the running direction of the substrate P. If this is done, the pitch between nozzles may be adjusted by adjusting the angle of the droplet discharge head 1. Moreover, the arrangement may be such that the distance between the substrate P and the nozzle surface can be arbitrarily adjusted.

Figure 2:
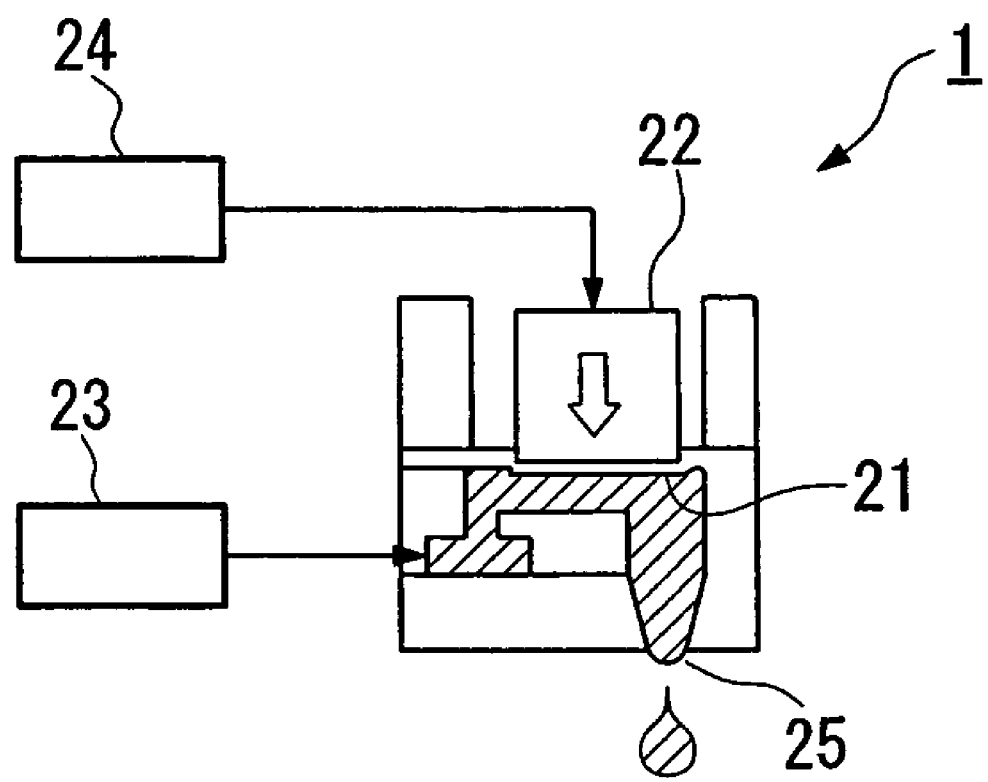
FIG. 2 is a diagram for explaining the principle of discharging a liquid body by a piezo method.

FIG. 2 is a diagram for explaining the principle of discharging a liquid material by a piezo method.

In FIG. 2, a piezo device 22 is installed adjacent to a liquid chamber 21 which accommodates a liquid material (wiring pattern ink, functional liquid). The liquid material is supplied into the liquid chamber 21 via a liquid material supplying system 23 including a material tank which accommodates the liquid material. The piezo device 22 is connected to a driving circuit 24. A voltage is applied to the piezo device 22 through this driving circuit 24 so as to deform the piezo device 22, so that the liquid chamber 21 is deformed to discharge the liquid material from the nozzle 25. In this case, the amount of distortion of the piezo device 22 is controlled by changing the value of the applied voltage. Moreover, the speed of distortion of the piezo device 22 is controlled by changing the frequency of the applied voltage. The advantage of the droplet discharge by the piezo method is that the material is not heated so that the composition of material is not affected.

Next is a description of a method of forming a conductive film wiring on a substrate, as an example of an embodiment of a wiring pattern forming method of the present invention, with reference to FIG. 3A to FIG. 3D. The wiring pattern forming method according to the present embodiment is to arrange the abovementioned wiring pattern ink on the substrate P so as to form a conductive film pattern for wiring, on the substrate P, and generally comprises; a bank forming step, a residue disposing step, a repellent treatment step, a material arranging step and intermediate drying step, and a baking step.

Hereunder is a detailed description of the respective steps.

(Bank Forming Step)

A bank is a member which functions as a partition member. The bank may be formed by any method such as a lithography method, a printing method or the like. For example, if the lithography method is used, then by a predetermined method such as spin coating, spray coating, roll coating, dye coating, dip coating or the like, an organic photosensitive material is coated onto a substrate P to match the height of the bank, and a resist layer is coated thereon. Then, a mask is applied matching the shape of the bank (wiring pattern) and the resist is exposed and developed so as to leave the resist matching the shape of the bank. Finally, the bank material of the rest of the mask portion is removed by etching. Moreover, a bank (ridge section) may be formed from two or more layers composed of a lower layer of an organic or inorganic material which is attractive with respect to the functional liquid and an upper layer of an organic material which shows repellency.

Figure 3A:
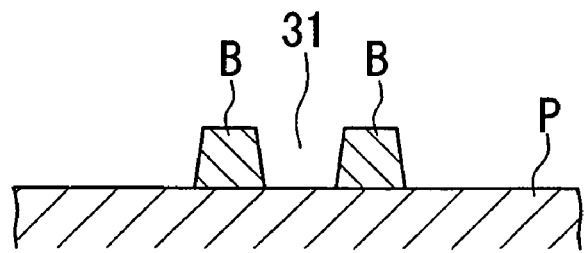
FIG. 3A to FIG. 3D show a procedure for forming a wiring pattern according to a first embodiment.

Therefore, as shown in FIG. 3A, banks B are formed for example, in 10 μm width so as to enclose a ditch section (coating region) 31 on which the wiring pattern is to be formed.

Prior to coating the organic material, HMDS treatment (a method of making $(CH_3)_3SiNHSi(CH_3)_3$ into vapor form for coating) is applied onto the substrate P for surface reforming treatment (not shown in FIG. 3A).

The organic material for forming the bank may be a material which is originally repellent with respect to the liquid material, or an insulating organic material which can be made repellent by a plasma treatment as described later, and which has good adhesiveness with the base substrate and is easily patterned by photolithography. For example, polymeric materials such as acrylic resin, polyimide resin, olefin resin, and melamine resin, may be used.

(Residue Disposing Step (Attractive Treatment Step))

Next, a residue disposing treatment is performed on the substrate P so as to remove resist (organic matter) residues between the banks from when forming the banks.

For the residue disposing treatment, an ultraviolet (UV) radiation treatment which disposes of the residue by irradiating ultraviolet, an $O_2$ plasma treatment which uses oxygen as a treatment gas in the atmospheric air, and the like may be selected. However, the $O_2$ plasma treatment is performed here.

Specifically, it is performed by irradiating oxygen in plasma state from a plasma discharging electrode. The condition of the $O_2$ plasma treatment is such that, for example, the plasma power is 50 to 1000 W, the oxygen gas flow rate is 20 to 100 mL(liter)/min, the conveyance speed of the substrate P with respect to the plasma discharging electrode is 0.5 to 10 mm/s and the temperature of the substrate is 70 to 90° C.

If the substrate P is a glass substrate, the surface is attractive with respect to a wiring pattern forming material. However, similarly to the present embodiment, by performing the $O_2$ plasma treatment or the ultraviolet radiation treatment for disposing residues, the ditch section 31 may be made more attractive. In the present embodiment, the condition of the plasma treatment is adjusted so that the contact angle of the ditch section 31 with respect to an organosilver compound (described later) used as the wiring pattern forming material, becomes below 15° (for example, the conveyance speed of the substrate P is decreased so as to extend the time for plasma treatment).

(Repellent Treatment Step)

Subsequently, the repellent treatment is performed on the bank B so as to impart repellency to the surface. For the repellent treatment, for example, a plasma treatment method which uses tetrafluoromethane as a treatment gas in atmospheric air ($CF_4$ plasma treatment method) may be adopted. The condition of the $CF_4$ plasma treatment is such that, for example, the plasma power is 100 to 800 W, the tetrafluoromethane gas flow rate is 50 to 100 mL(liter)/min, the substrate conveyance speed with respect to the plasma discharging electrode is 0.5 to 10 mm/s, and the temperature of the substrate is 70 to 90° C.

The treatment gas is not limited to tetrafluoromethane (carbon tetrafluoride) and other gas of fluorocarbon may be used. In the present embodiment, the condition of the plasma treatment is adjusted so that the contact angle of the organosilver compound used as the wiring pattern forming material with respect to the bank B becomes 40° or more larger than the contact angle with respect to the ditch section 31 (for example, the conveyance speed of the substrate P is decreased so as to extend the time for plasma treatment).

By performing such repellent treatment, a fluorine group is introduced into the resin constituting the banks B so as to impart a high repellency with respect to the ditch section 31. The abovementioned $O_2$ plasma treatment as the attractive treatment may be performed prior to forming the banks B. However due to the property that an acrylic resin or a polyimide resin is more easily fluorinated (made repellent) after pretreatment by $O_2$ plasma, the $O_2$ plasma treatment is preferably performed after forming the banks B.

Due to the repellent treatment on the banks B, there may be a slight effect on the surface of the substrate P on which the attractive treatment is previously performed. However, particularly in the case where the substrate P is composed of glass or the like, the fluorine group is not introduced by the repellent treatment, so that the attractive property, that is the wettability of the substrate P, is not substantially compromised.

Moreover, the banks B may be formed from a repellent material (for example, resin material having a fluorine group) so as to omit the repellent treatment.

By these bank forming step, residue disposing step, and repellent treatment step, the substrate for thin film patterning is formed.

(Material Arranging Step and Intermediate Drying Step)

Next, the wiring pattern forming material is coated on the ditch section 31 on the substrate P using the droplet discharge method, by the droplet discharge apparatus IJ. Here, an ink (functional liquid) composed of organosilver compound used as the conductive material and diethylene glycol dimethyl ether used as the solvent (dispersion medium) is discharged.

Figure 3B:
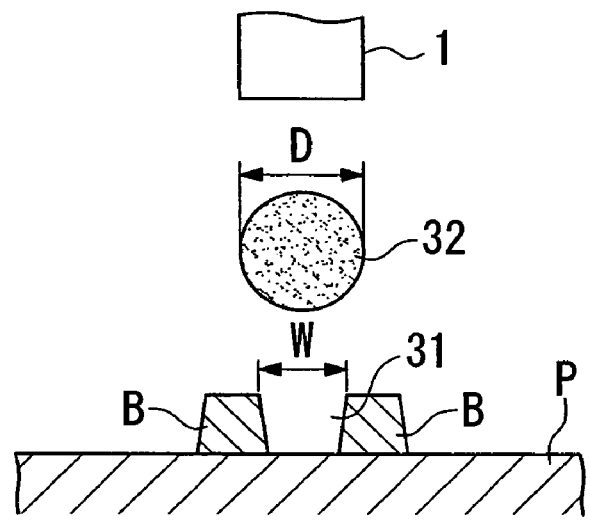

That is, in the material arranging step, as shown in FIG. 3B, the liquid material containing the wiring pattern forming material is discharged from the liquid discharge head 1 in the form of droplet 32 and the droplet 32 is arranged in the ditch section 31 on the substrate P. The condition of the droplet discharge is such that the ink weight is 4 ng/dot and the ink speed (discharge speed) is 5 to 7 m/s. In the present example, the arrangement is such that the diameter D of the droplet 32 is greater than the width W of the ditch section 31 formed by the banks B (in the present example, the width of the opening of the ditch section 31). Specifically, the arrangement is such that the width W of the opening of the ditch section 31 is below 10 μm and the diameter D of the droplet 32 is about 15 to 20 μm.

Figure 3C:
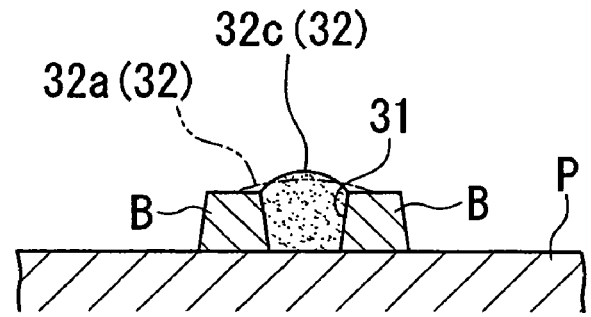

When such a droplet 32 is discharged from the droplet discharge head 1 to arrange the liquid body into the ditch section 31, since the diameter D of the droplet 32 is greater than the width W of the ditch section 31, as shown by the two-dot chain line in FIG. 3C, the droplet 32 is partially placed on the top of the banks B. However, the surface of the banks B is repellent and tapered so that the partial droplet 32 placed on the top of the banks B is repelled from the banks B, and then flows into the ditch section 31 due to the capillary phenomenon of the ditch section 31. As a result, as shown by the solid line in FIG. 3C, the whole droplet 32 goes into the ditch section 31.

Moreover, since the attractive treatment is performed on the substrate P, the liquid body 32a discharged into the ditch section 31 or flowing out from the banks B is easily spread out so that the liquid body 32a can be filled into the ditch section 31 more evenly. Therefore, although the width W of the ditch section 31 is narrower (smaller) than the diameter D of the droplet 32, the droplet 32 (liquid body 32a) discharged into the ditch section 31 goes into the ditch section 31 and is filled evenly therein.

(Intermediate Drying Step)

After discharging the droplet onto the substrate P, a drying treatment (intermediate drying) is performed for removing the dispersion medium as necessary. The drying treatment may be performed by a heat treatment, for example, by a normal hot plate, an electric furnace, or the like which heats up the substrate P. In the present embodiment, for example, the heating is performed at 180° C. for about 60 min. This heating is not necessarily performed in atmospheric air and may be performed under an atmosphere of $N_2$.

Moreover, this drying treatment can be performed by lamp annealing.

The light source of the light used for lamp annealing is not particularly limited. However an infrared lamp, a xenon lamp, a YAG laser, an argon laser, a carbon dioxide gas laser, and excimer lasers such as XeF, XeCl, XeBr, KrF, KrCl, ArF and ArCl may be used as the light source. These light sources are generally used in an output range of above 10 W and below 5000 W. However one in a range of above 100 W and below 1000 W is sufficient for the present embodiment.

By repeatedly performing this intermediate drying step and the abovementioned material arranging step, the film can be formed in a desired thickness.

(Baking Step)

Regarding the conductive material after the discharging step, if it is an organosilver compound for example, then in order to obtain conductivity, it is necessary to perform heat treatment so as to remove the organic component of the organosilver compound and leave the silver particles. For this purpose, heat treatment and/or light treatment is performed on the substrate after the discharging step.

The heat treatment and/or light treatment is normally performed in air, however it may be performed in an inert gas atmosphere such as nitrogen, argon and helium. The temperature of the heat treatment and/or light treatment is appropriately determined considering the boiling point (vapor pressure) of the dispersion medium, the kind and the pressure of the atmosphere gas, the thermal behavior such as the dispersibility or the oxidizability of the microparticles or organosilver compounds, the presence/absence of coatings, and the heat resistant temperature of the base material.

For example, it is necessary to bake at a temperature of about 200° C. so as to remove the organic component of the organosilver compound. Moreover, if a plastic substrate is used, it is preferably baked at a temperature of above room temperature and below 100° C.

Figure 3D:
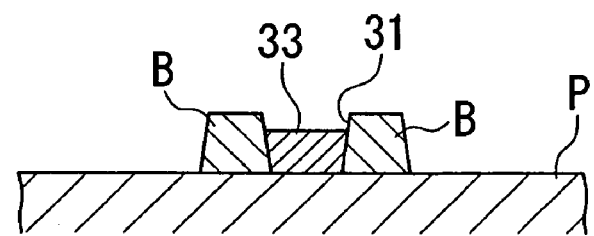

By means of the abovementioned steps, the conductive material (organosilver compound) after the discharging step is converted into a conductive film due to the residue of the silver particles so that, as shown in FIG. 3D, a conductive pattern as a continuous film, that is the wiring pattern (thin film pattern) 33 is obtained.

EXPERIMENTAL EXAMPLE

A glass substrate formed with banks was treated under conditions of; plasma power 550 W, tetrafluoromethane gas flow rate 100 mL/min, He gas flow rate 10 mL/min, and substrate conveyance speed with respect to the plasma discharging electrode of 2 mm/s. Consequently, the contact angle of the organosilver compound (diethylene glycol dimethyl ether solvent) was 66.2° with respect to the bank B after the repellent treatment, compared to below 10° with respect to the bank B before the repellent treatment. Moreover, the contact angle of pure water was 104.1° with respect to the bank B after the repellent treatment, compared to 69.3° with respect to the bank B before the repellent treatment. In both cases, the contact angle of the glass substrate with respect to the ditch section 31 was below 15°, and the difference between the contact angle with respect to the ditch section 31 and with respect to the bank B was above 40°.

Moreover, when discharging the droplet of the organosilver compound using the abovementioned droplet discharge apparatus U, on the substrate (bank material; organic photosensitive material) before the abovementioned repellent treatment, it was possible to fill the liquid body into the ditch section 31 having a width W of 100 μm. However it was not possible to sufficiently fill into one having a width W of 75 μm. On the other hand, on the substrate after the repellent treatment, even if the ditch section 31 had a microwidth W of 25 μm or 10 μm, it was possible to fill this with the liquid body.

In this way, in present embodiment, as a substrate for patterning, the difference between the contact angle of the liquid body with respect to the ditch section 31 and the contact angle of the liquid body with respect to the bank B is made above 40°. Therefore, even in the case where the droplet is partially placed on the top of the banks B, the droplet may go into the ditch section 31, enabling a fine linear pattern defined by the width between the banks B to be obtained. Particularly in the present embodiment, the contact angle of the liquid body with respect to the ditch section 31 is made below 15°, even if the ditch is narrower than the droplet, so that it is possible to fill with the liquid body to realize the fine linear pattern. Moreover, the liquid body of the ditch section 31 becomes wet to spread out on the substrate P more easily so that the liquid body can be filled into the ditch section 31 more evenly. Therefore, the liquid bodies discharged at intervals can be integrated without being segmented in the ditch section 31, which enables prevention of defects such as disconnections, and also improvement of the quality as a device.

Second Embodiment

Next is a description of a method of forming a conductive film wiring on a substrate, as a second embodiment of a wiring pattern forming method (pattern forming method) of the present invention, with reference to FIG. 4A to FIG. 4D.

The wiring pattern forming method according to the present embodiment is to arrange the abovementioned wiring pattern ink on the substrate P so as to form a conductive film pattern for wiring (conductive film) on the substrate P, and generally includes; a surface treatment step, a material arranging step, and a heat treatment/light treatment step.

Hereunder is a detailed description of the respective steps.

(Surface Treatment Step)

The surface treatment step is roughly divided into a repellent treatment step for making the surface of a substrate repellent, and a attractive treatment step for making the surface of the substrate made repellent, attractive.

In the repellent treatment step, the surface of the substrate which forms a conductive film wiring is processed to make this repellent with respect to the liquid material. Specifically, surface treatment is performed on the substrate so that the difference between the contact angle of the liquid material containing the conductive particles and the contact angle with respect to the coating region described later, becomes above 40°, preferably above 50°.

For a method of controlling the repellency (wettability) on a surface, for example a method of forming a self organizing film on the surface of the substrate may be employed.

In the self organizing film forming method, a self organizing film composed of an organic film or the like is formed on the surface of the substrate on which the conductive film wiring is to be formed.

The organic film material for treating the substrate surface includes a functional group which can bond with the substrate, a functional group for reforming the surface of the substrate (controlling surface energy), such as a attractive group or repellent group, which exits on the opposite side of the functional group which can bond with the substrate, and a straight chain of carbon or a partially branched carbon chain for connecting these functional groups. This material bonds with the substrate, self-organizes and forms a molecular film, such as monomolecular film.

Here, the self organizing film includes a bonding functional group which can react with atoms constituting the under layer, such as a substrate, and other straight chain molecules, which are formed by orienting a compound which has an extremely high orientation characteristic due to the interaction of the straight chain molecules. Since this self organizing film is made of oriented monomolecules, film thickness can be extremely thin, and is uniform at the molecular level. In other words, since molecules of the same structures are positioned on the surface of the film, even and superior attractive and repellent property can be applied onto the surface of the film.

By using fluoroalkylsilane as the compound having a high orientation characteristic, for example, the self organizing film is formed by each compound being oriented such that the fluoroalkyl group positions on the surface of the film, so that even and superior repellency can be imparted to the surface of the film.

Examples of compounds for forming the self organizing film include; fluoroalkylsilanes, such as heptadecafluoro-1,1,2,2 tetrahydrodesyltriethoxysilane, heptadecafluoro-1,1,2,2 tetrahydrodesyltrimethoxysilane, heptadecafluoro-1,1,2,2 tetrahydrodesyltrichlorosilane, tridecafluoro-1,1,2,2 tetrahydrooctyltriethoxysilane, tridecafluoro-1,1,2,2 tetrahydrooctyltrimethoxysilane, tridecafluoro-1,1,2,2 tetrahydrooctyltrichlorosilane and trifluoropropyltrimethoxysilane (hereafter "FAS"). Regarding these compounds, one compound may be used, however two or more types of compounds may be combined for use. By using the FAS, it is possible to obtain adhesiveness with the substrate and excellent repellency.

FAS is generally expressed by a constitutional formula $RnSiX_{(4-n)}$. Here n is a 1 or higher and a 3 or lower integer, X is a hydrolysis group such as the methoxy group, ethoxy group and halogen atoms. R is a fluoroalkyl group, which has the structure $(CF_3)(CF_2)x(CH_2)y$ (where x is a 0 or higher and a 10 or lower integer, y is a 0 or higher and a 4 or lower integer), and if a plurality of groups R or X are combined with Si, then all the groups R or X may be the same or different. The hydrolysis group expressed by X forms silanol by hydrolysis, and bonds with the substrate by siloxane bonding, reacting with the hydroxyl group of the substrate (glass, silicon). On the other hand, R has a fluoro group such as $(CF_2)$ on the surface, which reforms the ground surface of the substrate into a surface which does not get wet (surface energy is low).

The self organizing film composed of an organic film or the like is formed on the substrate when the above-mentioned raw material compound and the substrate are set in the same sealed container and left for 2-3 days at room temperature. If the entire sealed container is held at 100° C., the self organizing film is formed on the substrate in about three hours. This is a method of forming self organizing film from a vapor phase, but self organizing film can be formed from a liquid phase as well. For example, when the substrate is dipped into a solution containing the raw material compound, and is cleaned and dried, the self organizing film is generated on the substrate.

It is preferable to perform a pretreatment on the surface of the substrate by irradiating ultraviolet, or cleaning using solvent before forming the self organizing film.

Figure 4A:
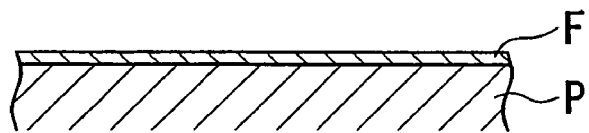
FIG. 4A to FIG. 4D show a procedure for forming a wiring pattern according to a second embodiment.

In this manner, by performing the self organizing film forming method, as shown in FIG. 4A, a repellent film F is formed on the surface of the substrate P.

Next, a wiring pattern forming material is coated so as to reduce the repellency of a coating region on which the wiring pattern is to be formed, and impart the attractive property (attractive treatment), so that the wettability of the surface of the substrate can be controlled.

Hereunder is a description of the attractive treatment.

Figure 4B:
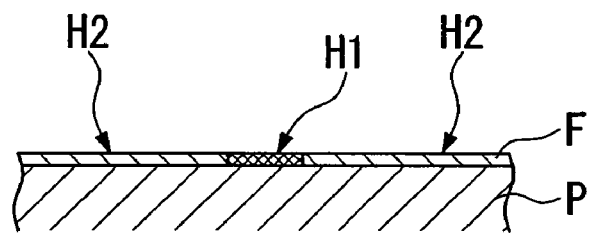

Examples of attractive treatment include a method of irradiating ultraviolet light having a wavelength of 170 to 400 nm. At this time, by irradiating ultraviolet light using a mask corresponding to the wiring pattern, only the wiring portion on the repellent film F which was once formed, can be partially deteriorated so as to lessen the repellency and make this attractive. That is, by performing the abovementioned repellent treatment and the attractive treatment, as shown in FIG. 4B, a coating region H1 with attractiveity imparted to the position on which the wiring pattern is to be formed, and a repellent region H2 composed of the repellent film F enclosing the coating region H1 are formed on the substrate P.

The degree of the release of the repellency may be adjusted by the ultraviolet radiation time, however it may be also adjusted by a combination of the intensity and the wavelength of ultraviolet light, the heat treatment (heating up), and the like. In the present embodiment, the ultraviolet light is irradiated in a condition where the contact angle with respect to the coating region H1 becomes less than 15°, so that the difference between the contact angle of the liquid material containing the conductive particles with respect to the coating region H1 and the contact angle with respect to the repellent region H2 becomes larger than 40°.

(Material Arranging Step)

Next, the wiring pattern forming material is coated onto the coating region H1 on the substrate P using the droplet discharge method, by the droplet discharge apparatus IJ. Here, as the functional liquid (wiring pattern ink), a dispersing liquid being a solvent (dispersion medium) with conductive particles dispersed therein, is discharged. For the conductive particles used here, as well as metal particles which contain gold, silver, copper, palladium, or nickel, a conductive polymer or superconductive particles are used.

Figure 4C:
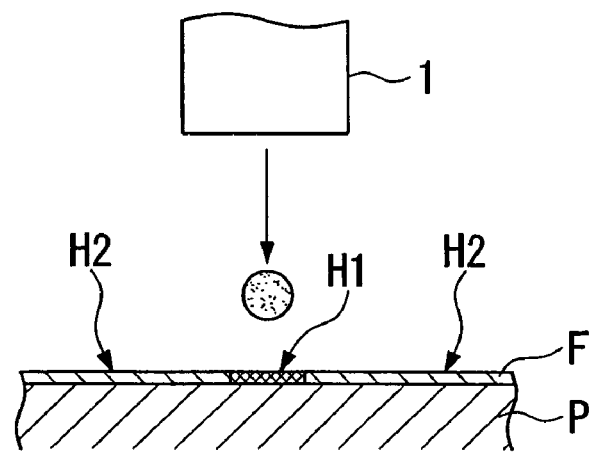

That is, in the material arranging step, as shown in FIG. 4C, the liquid material containing the wiring pattern forming material is discharged from the liquid discharge head 1 in the form of droplet, and the droplet is arranged in the coating region H1 on the substrate P. The condition of the droplet discharge is such that the ink weight is 7 ng/dot and the ink speed (discharge speed) is 5 to 7 m/s.

Figure 4D:
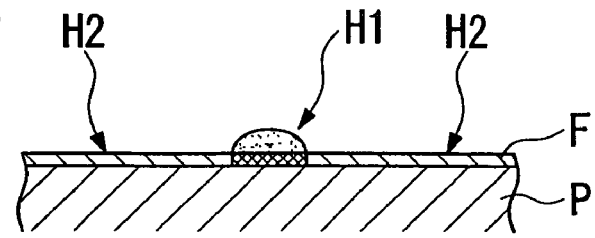

At this time, since the repellent region H2 is made repellent, even if the droplet is partially placed on the top of the repellent region H2, it is repelled from the repellent region H2. Consequently, as shown in FIG. 4D, the droplet stays on the coating region H1 between the repellent region H2. Furthermore, since the coating region H1 is made attractive, the discharged liquid body can easily spread out on the coating region H1 so that the liquid body can be filled into the coating region H1 more evenly without being segmented in a predetermined position.

(Heat Treatment/Light Treatment Step)

Regarding the conductive material after the discharging step, it is necessary to completely remove the dispersion medium so as to increase the electrical contact between particles. Moreover, in the case where a coating material such as organic matter is coated on the surface of these conductive particles in order to increase the dispersibility, it is also necessary to completely remove this coating material. For this purpose, the heat treatment and/or light treatment is performed on the substrate after the discharging step.

The heat treatment and/or light treatment is normally performed in air. However it may be performed in an inert gas atmosphere such as nitrogen, argon and helium. The temperature of the heat treatment and/or light treatment is appropriately determined considering the boiling point (vapor pressure) of the dispersion medium, the kind and the pressure of the atmosphere gas, the thermal behavior such as the dispersibility or the oxidizability of the microparticles, the presence/absence of coatings, and the heat resistant temperature of the base material.

For example, it is necessary to bake at a temperature of about 300° C. so as to remove the coating material composed of organic matter. Moreover, if a plastic substrate is used, it is preferably baked at a temperature of above room temperature and below 100° C.

The heat treatment and/or light treatment may be performed by lamp annealing as well as a general heat treatment using, for example, a hot plate, an electric furnace, or the like. The light source of the light used for lamp annealing is not particularly limited, however an infrared lamp, a xenon lamp, a YAG laser, an argon laser, a carbon dioxide gas laser, and excimer lasers such as XeF, XeCl, XeBr, KrF, KrCl, ArF and ArCl may be used. These light sources are generally used in the output range of above 10 W and below 5000 W. However one in a range of above 100 W and below 1000 W is sufficient for the present embodiment.

By the abovementioned heat treatment and/or light treatment, electrical contact between particles can be ensured, and these can be converted into the conductive film.

By the series of the steps described above, the linear conductive film pattern (conductive film wiring) is formed on the substrate.

In present embodiment, as a substrate for patterning, the difference between the contact angle of the functional liquid with respect to the coating region H1 and the contact angle of the functional liquid with respect to the repellent region H2 is made above 40°. Therefore, even in the case where the droplet is partially placed on the top of the repellent region H2, the droplet may flow into the coating region H1, enabling a fine linear pattern defined by the width between the repellent region H2 to be obtained. Particularly in the present embodiment, the contact angle of the liquid body with respect to the coating region H1 is made below 15°, so that the liquid body of the coating region H1 becomes wet to spread out on the substrate P more easily, so that the liquid body can be filled onto the coating region H1 more evenly. Therefore, the liquid bodies discharged at intervals can be integrated without being segmented on the coating region H1, which enables prevention of defects such as disconnections, and also improvement of the quality as a device.

Third Embodiment

Figure 5:
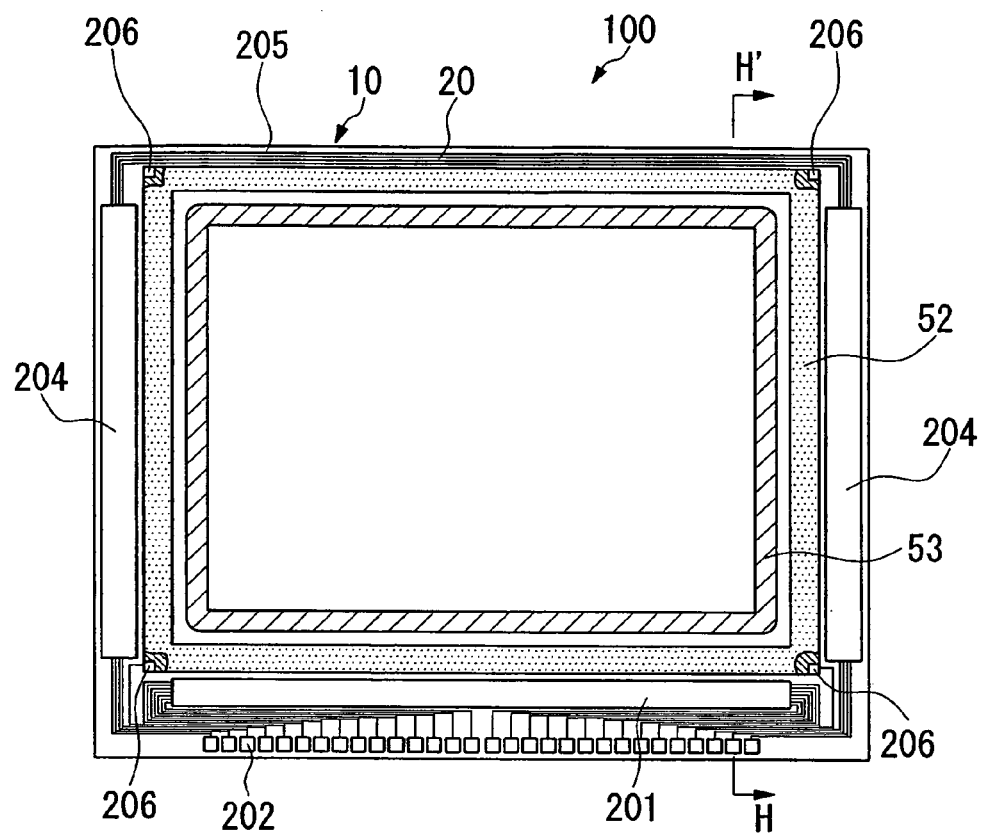
FIG. 5 is a plan view of a liquid crystal display viewed from the side of a facing substrate.
Figure 6:
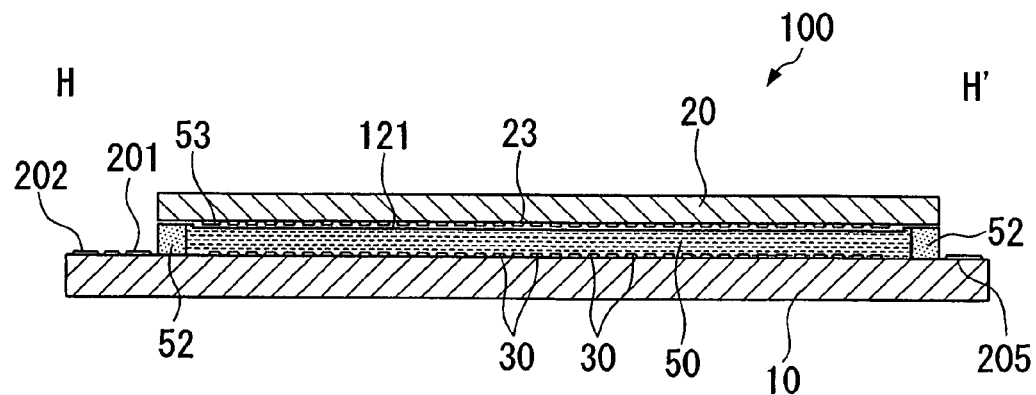
FIG. 6 is a sectional view taken along a line H-H' of FIG. 5.
Figure 7:
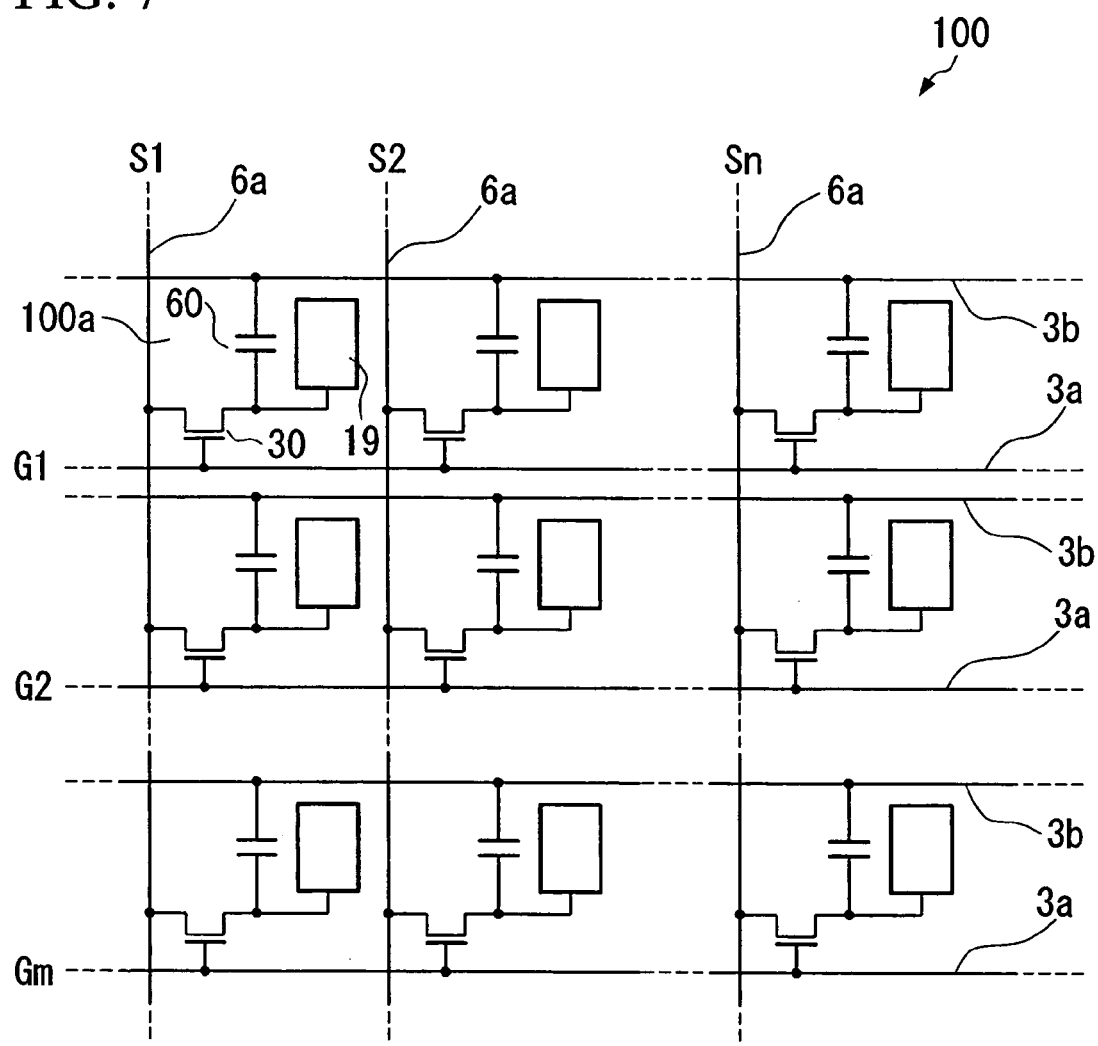
FIG. 7 is an equivalent circuit diagram of the liquid crystal display.
Figure 8:
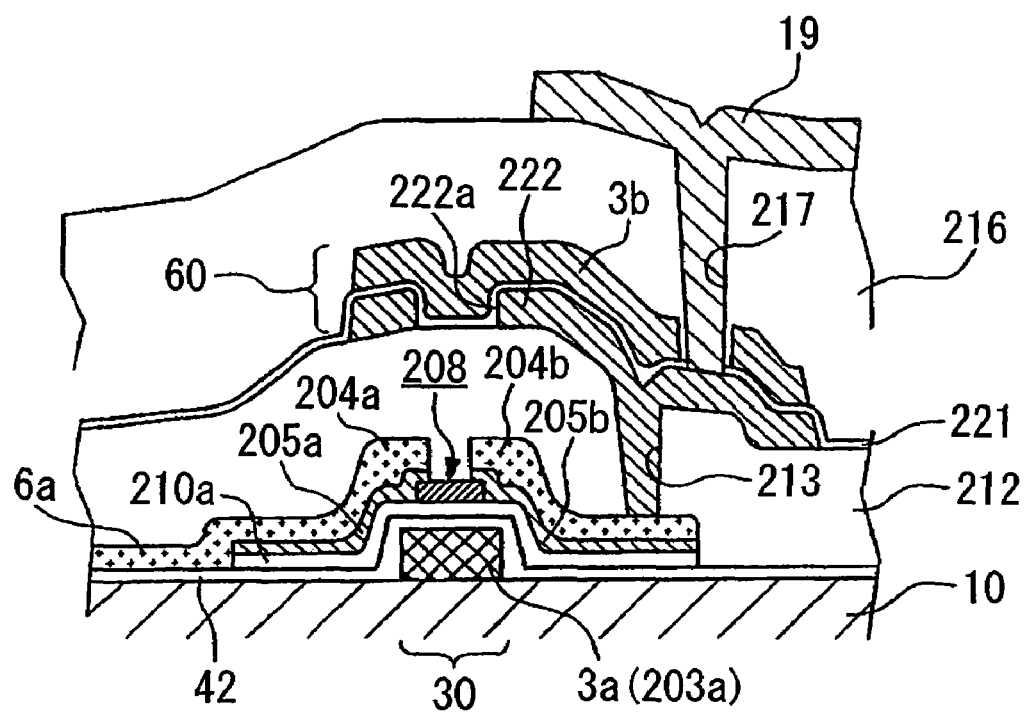
FIG. 8 is an enlarged sectional view of part of a liquid crystal display.

Next as a third embodiment, is a description of a liquid crystal display which is an example of the electro-optical apparatus of the present invention. FIG. 5 is a plan view of a liquid crystal display and the respective components according to the present invention, viewed from the facing substrate side. FIG. 6 is a sectional view taken along a line H-H' of FIG. 5. FIG. 7 is an equivalent circuit diagram of various kinds of elements, wiring, and the like in a plurality of pixels formed in a matrix in an image display region of the liquid crystal display. FIG. 8 is an enlarged sectional view of part of the liquid crystal display. In the respective drawings used in the description hereunder, the degree of reduction may differ depending on respective layers and respective members, so as to make them into a recognizable size.

In FIG. 5 and FIG. 6, a liquid crystal display (electro-optical apparatus) 100 of the present embodiment includes; a TFT array substrate 10 and a facing substrate 20 which form a pair with each other, and which are adhered by a sealing material 52 being a photocurable sealing material. A liquid crystal 50 is filled into and retained in a region sectioned by this sealing material 52. The sealing material 52 is formed in a closed frame shape in a region within the substrate surface, and is of a construction with no liquid crystal inlet nor traces of its sealing by a sealing material.

In a region inside of the region formed by the sealing material 52, a peripheral parting 53 being a shading material is formed. Outside of the sealing material 52, a data line driving circuit 201 and mounting terminals 202 are formed along one side of the TFT array substrate 10, and scanning line driving circuits 204 are formed along the two sides adjacent to this side. On the remaining one side of the TFT array substrate 10, a plurality of wirings 205 are provided for connecting between the scanning line driving circuits 204 provided on both sides of the image display region. Moreover, on at lease one section of the corners of the facing substrate 20, intra-substrate conductive materials 206 are provided and arranged for electrically connecting between the TFT array substrate 10 and the facing substrate 20.

Instead of forming the data line driving circuit 201 and the scanning line driving circuits 204 on the TFT array substrate 10, for example, a TAB (Tape Automated Bonding) substrate mounted with a driving LSI, and a terminal group formed at the periphery of the TFT array substrate 10, may be electrically and mechanically connected via an anisotropic conductive film. On the liquid crystal display 100, a phase contrast plate, a polarizing plate, or the like is arranged in a predetermined direction according to the kind of liquid crystal 50 to be used, that is, according to the operation mode such as TN (Twisted Nematic) mode, C-TN method, VA method, IPS method, or normal white mode/normal black mode, however this is not shown here.

Moreover, in the case where the liquid crystal display 100 is constituted for use as a color display, then on the facing substrate 20, for example, color filters of red (R), green (G), and blue (B) are formed with their protective films, in the regions facing the respective pixel electrodes of the TFT array substrate 10, described later.

In the image display region of the liquid crystal display 100 having such a construction, as shown in FIG. 7, a plurality of pixels 100a are configured in a matrix form, TFTs (switching elements) 30 for pixel switching are formed in these respective pixels 100a, and data lines 6a which supply pixel signals S1, S2, to Sn, are electrically connected to the sources of the TFTs 30. The pixel signals S1, S2, to Sn, for writing to the data lines 6a may be line-sequential supplied in this order, or may be supplied to each group with respect to adjacent pairs of data lines 6a. Moreover, the configuration is such that the scanning lines 3a are electrically connected to the gates of the TFTs 30, and scanning signals G1, G2, to Gm are applied pulsewise to the scanning lines 3a, in this line-sequential order at a predetermined timing.

The pixel electrodes 19 are electrically connected to the drains of the TFTs 30 so as to power ON the TFTs 30 which are the switching elements, only in a fixed period so that the pixel signals S1, S2, to Sn supplied from the data lines 6a can be written into the respective pixels at a predetermined timing. In this manner, the pixel signals S1, S2, to Sn of the predetermined level written into the liquid crystal through the pixel electrodes 19 are retained for a fixed period between counter electrodes 121 of the facing substrate 20 shown in FIG. 6. In order to prevent leakage of the retained pixel signals S1, S2, to Sn, storage capacitances 60 are added in parallel to the liquid crystal capacitances formed between the pixel electrodes 19 and the counter electrodes 121. For example, the voltage of the pixel electrodes 19 is retained by the storage capacitances 60 for a time which is thousands of times longer than the time for which the source voltage is applied. Consequently, the retention property of the electric charge can be improved so as to realize a liquid crystal display 100 having a high contrast ratio.

FIG. 8 is an enlarged sectional view of part of the liquid crystal display 100 having a bottom gate type TFT 30. In the present embodiment, the storage capacitance 60 is constructed above the bottom gate type TFT 30 for pixel switching. More specifically, on the TFT array substrate 10 (corresponding to the substrate P in the abovementioned wiring pattern forming method), a semiconductor layer 210a is laminated via a gate insulating film 42, on a portion of a gate electrode 203a projecting above the substrate, from the scanning line 3a along the data line 6a. A portion of the semiconductor layer 210a facing this gate electrode 203a portion is a channel region. On the semiconductor layer 210a, a source electrode 204a and a drain electrode 204b are formed from a film identical to the data line 6a. Respectively between the source electrode 204a and the semiconductor layer 210a, and between the source electrode 204b and the semiconductor layer 210a, a connection layer 205a and a connection layer 205b composed of, for example, an n+ type a-Si (amorphous silicon) layer, are laminated for obtaining ohmic connection. On the semiconductor layer 210a in the center of the channel region, an insulative etch stop film 208 for protecting the channel is formed. On the edge of the drain electrode 204b, an insular capacitative electrode 222 is laminated via an interlayer insulating film 212. Furthermore, on the capacitative electrode 222, a capacitative line 3b (capacitative electrode on the fixed potential side) is laminated via a dielectric film 221. Moreover, the capacitative line 3b extends in stripes in the image display region, and is provided to extend to outside of the image display region, and then drops to a fixed potential.

Above the storage capacitance 60, a pixel electrode 19 is arranged. Between the capacitative line 3b and the pixel electrode 19, an interlayer insulating film 216 is laminated. The pixel electrode 19 and the capacitative electrode 222 are connected via a contact hole 217 opened in the interlayer insulating film 216 so that the capacitative electrode 222 becomes the pixel electrode potential. Moreover, a hole-shape opening 222a is provided above the TFT 30 channel region in the capacitative electrode 222.

In the TFT of the above configuration, for example, droplets of silver compound are discharged using the droplet discharge apparatus IJ described above, enabling forming of the gate lines, the source lines, and the drain lines. Therefore, it becomes possible to obtain a high quality liquid crystal display, which can be decreased in size and thickness due to the fine linear pattern, and in which defects such as disconnection rarely occur.

Fourth Embodiment

In the above embodiment, the configuration is one where the TFTs 30 are used as switching elements for driving the liquid crystal display 100. However, besides the liquid crystal display, for example, it may be applied to an organic EL (electroluminescence) display device. An organic EL display device has a configuration where a thin film containing fluorescent inorganic or organic compounds is sandwiched between a negative electrode and a positive electrode. It is a device in which electrons and positive holes (holes) are injected to excite the thin film and produce excitons, and uses the light emitted (fluorescence, phosphorescence) when the excitons are recombined, to generate light. Moreover, on the substrate having the TFTs 30, of the fluorescent materials used for the organic EL display device, materials showing the respective fluorescent colors of red, green and blue, that is a fluorescent layer forming material, and materials for forming the electron holes injecting/electron transferring layer, are used for the ink, and the respective layers are patterned so that a self-fluorescing full color EL device can be manufactured.

The scope of the device (electro-optical apparatus) in the present invention includes such an organic EL device, and it becomes possible to obtain a high quality organic EL device which can be decreased in size and thickness, and in which defects such as disconnection rarely occur.

Figure 9:
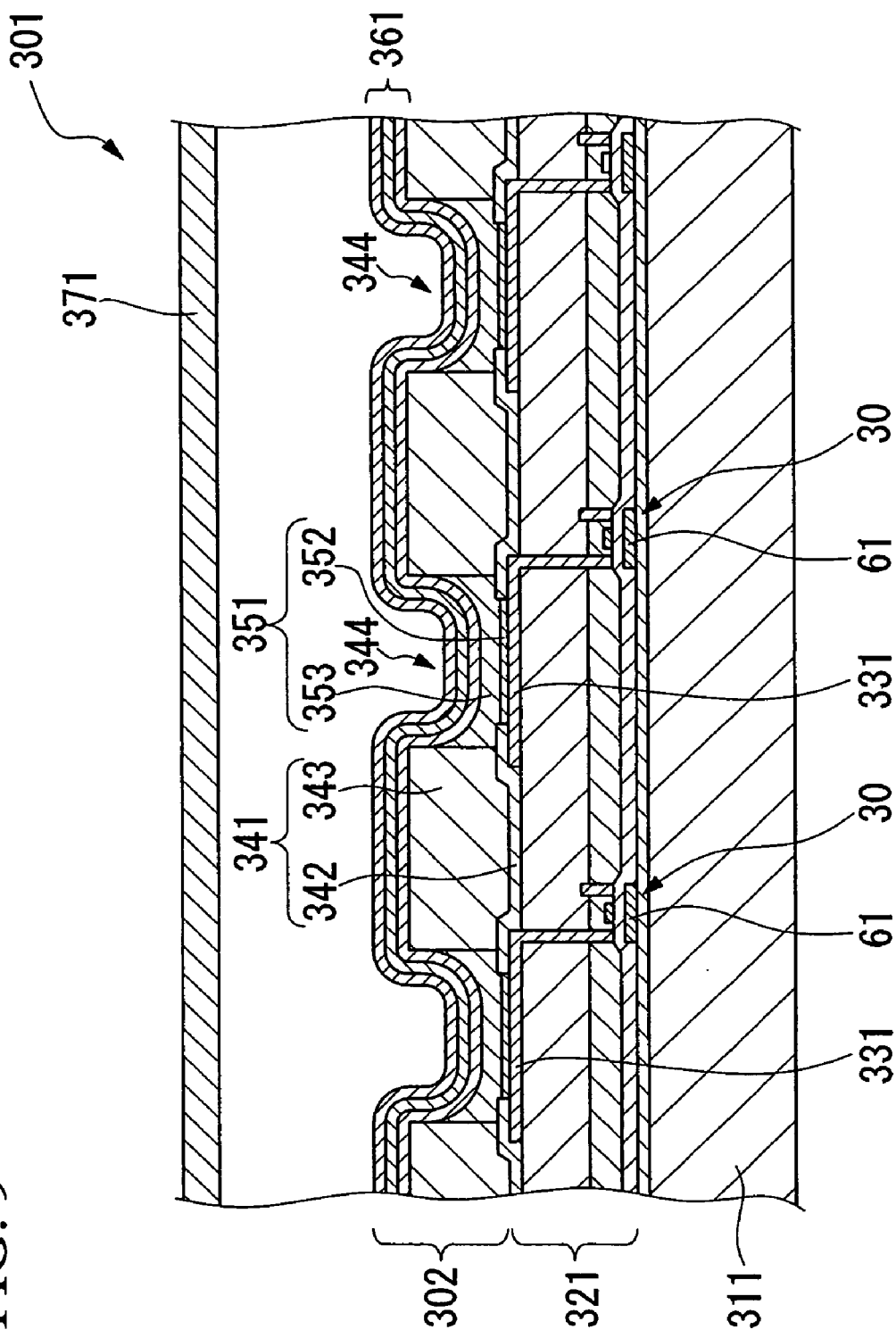
FIG. 9 is an enlarged sectional view of part of an organic EL apparatus.

FIG. 9 is a sectional side view of an organic EL apparatus in which some components are manufactured by the aforementioned droplet discharge apparatus IJ. A general configuration of the organic EL apparatus is described with reference to FIG. 9.

In FIG. 9, an organic EL apparatus 301 is an organic EL element 302 comprising; a substrate 311, a circuit element section 321, pixel electrodes 331, bank sections 341, light emission elements 351, a negative electrode 361 (counter electrode), and a sealing substrate 371 connected to wiring of a flexible substrate (not shown) and a driving IC (not shown). The circuit element section 321 is an active element TFT 30 formed on the substrate 311, having a configuration such that a plurality of pixel electrodes 331 are arrayed on the circuit element section 321. Moreover, a gate wiring 61 constituting the TFT 30 is formed by the wiring pattern forming method of the above embodiment.

Between the respective pixel electrodes 331, the bank sections 341 are formed in grid form. In a crevice opening 344 produced by the bank sections 341, a light emission element 351 is formed. The light emission element 351 is composed of an element which emits red fluorescence, an element which emits green fluorescence, and an element which emits blue fluorescence. Therefore the organic EL apparatus 301 can display in full colors. The negative electrode 361 is formed over the whole top surface of the bank sections 341 and the light emission elements 351. On the negative electrode 361, the sealing substrate 371 is laminated.

The manufacturing process of the organic EL apparatus 301 including the organic EL element includes; a bank section forming step for forming the bank sections 341, a plasma treatment step for appropriately forming the light emission elements 351, a light emission element forming step for forming the light emission elements 351, a counter electrode forming step for forming the negative electrode 361, and a sealing step for laminating the sealing substrate 371 onto the negative electrode 361 so as to seal it.

The light emission element forming step is one where on a crevice opening 344, that is a pixel electrode 331, an electron holes injecting layer 352 and a fluorescent layer 353 are formed so as to form a light emission element 351, and includes an electron holes injecting layer forming step and a fluorescent layer forming step. The electron holes injecting layer forming step includes a first discharging step for discharging a liquid material for forming the electron holes injecting layer 352 onto the respective pixel electrode 331, and a first drying step for drying the discharged liquid material so as to form the electron holes injecting layer 352. Moreover, the fluorescent layer forming step comprises a second discharging step for discharging a liquid material for forming the fluorescent layer 353 onto the electron holes injecting layer 352, and a second drying step for drying the discharged liquid material so as to form the fluorescent layer 353. As described above, the fluorescent layer 353 is composed of three kinds formed by materials corresponding to the three colors of red, green and blue. Therefore, the second discharging step includes three steps for respectively discharging the three kinds of materials.

In this light emission element forming step, the droplet discharge apparatus IJ may be used at the first discharging step in the electron holes injecting layer forming step, and at the second discharging step in the fluorescent layer forming step.

Fifth Embodiment

In the above embodiment, the gate wiring of TFT (thin film transistor) is formed using the pattern forming method according to the present invention. However, it is also possible to manufacture other components such as the source electrode, drain electrode, pixel electrode, and the like. Hereunder is a description of methods for manufacturing the TFT, with reference to FIG. 10 to FIG. 13.

Figure 10:
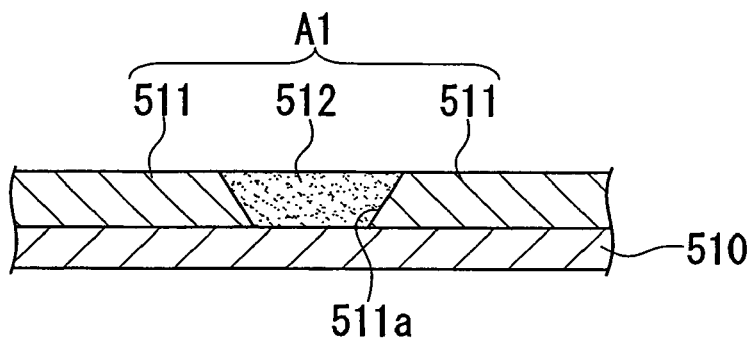
FIG. 10 is a diagram for explaining a step for manufacturing a thin film transistor.

As shown in FIG. 10, firstly, on the top surface of a washed glass substrate 510, first layer banks 511 for providing a ditch 511a of 1/20 to 1/10 times one pixel pitch, are formed based on the photolithography method. These banks 511 should be optically transparent and repellent after being formed. For the material, in addition to polymeric materials such as acrylic resin, polyimide resin, olefin resin, and melamine resin, inorganic material such as polysilazane may be suitably used.

In order to give repellency to these banks 511 after being formed, it is necessary to perform $CF_4$ plasma treatment (plasma treatment using a gas containing a fluorine component). However instead, repellent components (such as fluorine group) may be previously filled into the material itself of the banks 511. In this case, the $CF_4$ plasma treatment may be omitted.

It is preferable to ensure that the contact angle of the discharge ink with respect to the banks 511 made repellent in the above manner, is above 40° and the contact angle with respect to the glass surface is below 10°. That is, from results confirmed by examination by the present inventors, for example, a contact angle after treatment, of conductive particles (tetradecane solvent) can be ensured at about 54.0° if an acrylic resin or the like is used for the material of the bank 511 (below 10° in the case without the treatment). This contact angle was obtained under a treatment condition where tetrafluoromethane gas was supplied at a flow rate of 0.1 mL/min under a plasma power of 550 W.

In a gate scanning electrode forming step (a first conductive pattern forming step) following the abovementioned first layer bank forming step, by discharging droplets containing conductive material by the inkjet to fill in the ditch 511a which is the drawing region sectioned by the banks 511, gate scanning electrodes 512 are formed. When forming the gate scanning electrodes 512, the pattern forming method according to the present invention is applied.

For the conductive material at this time, Ag, Al, Au, Cu, Pd, Ni, W-si, and a conductive polymer may be suitably employed. Regarding the gate scanning electrodes 512 formed in this manner, since the banks 511 are previously imparted with sufficient repellency, a fine wiring pattern can be formed without overflowing beyond the ditch 511a.

By the abovementioned steps, on the substrate 510, a first conductive layer Al composed of silver (Ag) having a flat top surface comprising the banks 511 and the gate scanning electrodes 512 is formed.

Moreover, in order to obtain a good result in discharging into the ditch 511a, as shown in FIG. 10, a diverging tapered shape (a taper shape opening in a direction towards the discharge source) is preferably employed for the shape of the ditch 511a. Therefore, the discharged droplets can enter sufficiently deeply inside.

Figure 11:
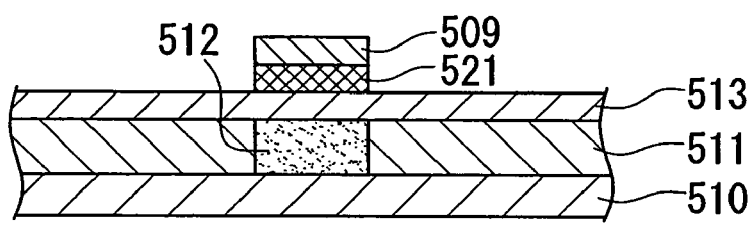
FIG. 11 is a diagram for explaining a step for manufacturing the thin film transistor.

Next, as shown in FIG. 11, by the plasma CVD method, a gate insulating film 513, an active layer 521, and a contact layer 509 are successively formed. A silicon nitride film used for the gate insulating film 513, an amorphous silicon film used for the active layer 521, and an n⁺ type silicon film used for the contact layer 509, are formed by changing the material gas and the plasma conditions. If they are formed by the CVD method, a heat history of 300° C. to 350° C. is required. However, it is possible to avoid problems related to the transparency and the thermal resistance by using inorganic material for the banks.

Figure 12:
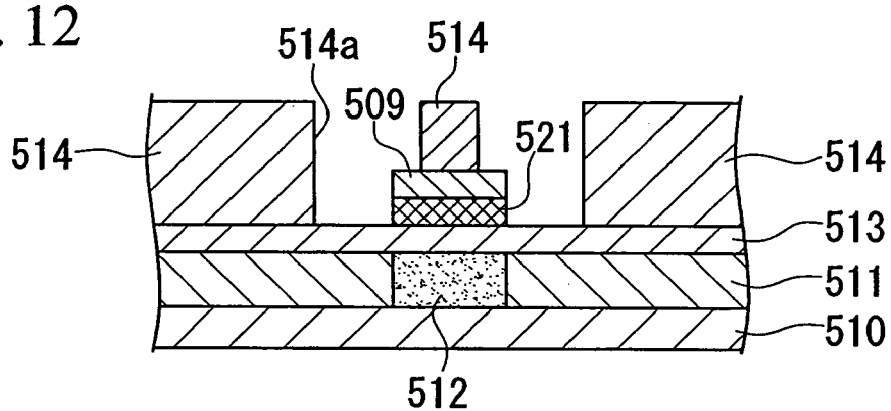
FIG. 12 is a diagram for explaining a step for manufacturing the thin film transistor.
Figure 13:
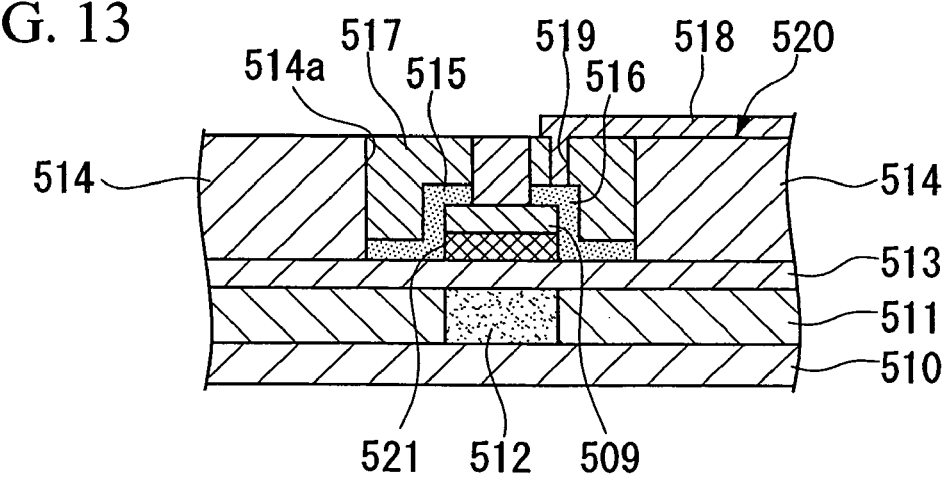
FIG. 13 is a diagram for explaining a step for manufacturing the thin film transistor.

In a second layer bank forming step following the abovementioned semiconductor layer forming step, as shown in FIG. 12, on the top surface of the gate insulating film 513, second layer banks 514 for providing a ditch 514a of ¹⁄₂₀ to ¹⁄₁₀ times one pixel pitch and crossing the ditch 511a, are formed based on the photolithography method. These banks 514 should be optically transparent and repellent after being formed. For the material, in addition to polymeric materials such as acrylic resin, polyimide resin, olefin resin, and melamine resin, inorganic material such as polysilazane may be suitably used.

In order to give repellency to these banks 514 after being formed, it is necessary to perform $CF_4$ plasma treatment (plasma treatment using a gas containing a fluorine component). However instead, repellent components (such as fluorine group) may be previously filled into the material itself of the banks 514. In this case, the $CF_4$ plasma treatment may be omitted.

It is preferable to ensure that the contact angle of the discharge ink with respect to the banks 514 made repellent in the above manner, is above 40°.

In a source/drain electrode forming step (a second conductive pattern forming step) following the abovementioned second layer bank forming step, by discharging droplets containing conductive material by the inkjet to fill in the ditch 514a which is the drawing region sectioned by the banks 514, source electrodes 515 and source electrodes 516 crossing with respect to the gate scanning electrode 512, are formed. When forming the source electrodes 515 and the drain electrodes 516, the pattern forming method according to the present invention is applied.

For the conductive material at this time, Ag, Al, Au, Cu, Pd, Ni, W-si, and a conductive polymer may be suitably employed. Regarding the source electrodes 515 and the drain electrodes 516 formed in this manner, since the banks 514 are previously imparted with sufficient repellency, a fine wiring pattern can be formed without overflowing beyond the ditch 514a.

Moreover, an insulating material 517 is positioned so as to fill in the ditch 514a which positions the source electrodes 515 and the drain electrodes 516. By the abovementioned steps, on the substrate 510, a flat top surface 520 comprising the banks 514 and the insulating material 517 is formed.

Then, contact holes 519 are formed in the insulating material 517, and patterned pixel electrodes of indium tin oxide (ITO) 518 are formed on the top surface 520, and the drain electrodes 516 and the pixel electrodes 518 are connected via the contact holes 519 to thereby form the TFT.

Sixth Embodiment

Figure 14:
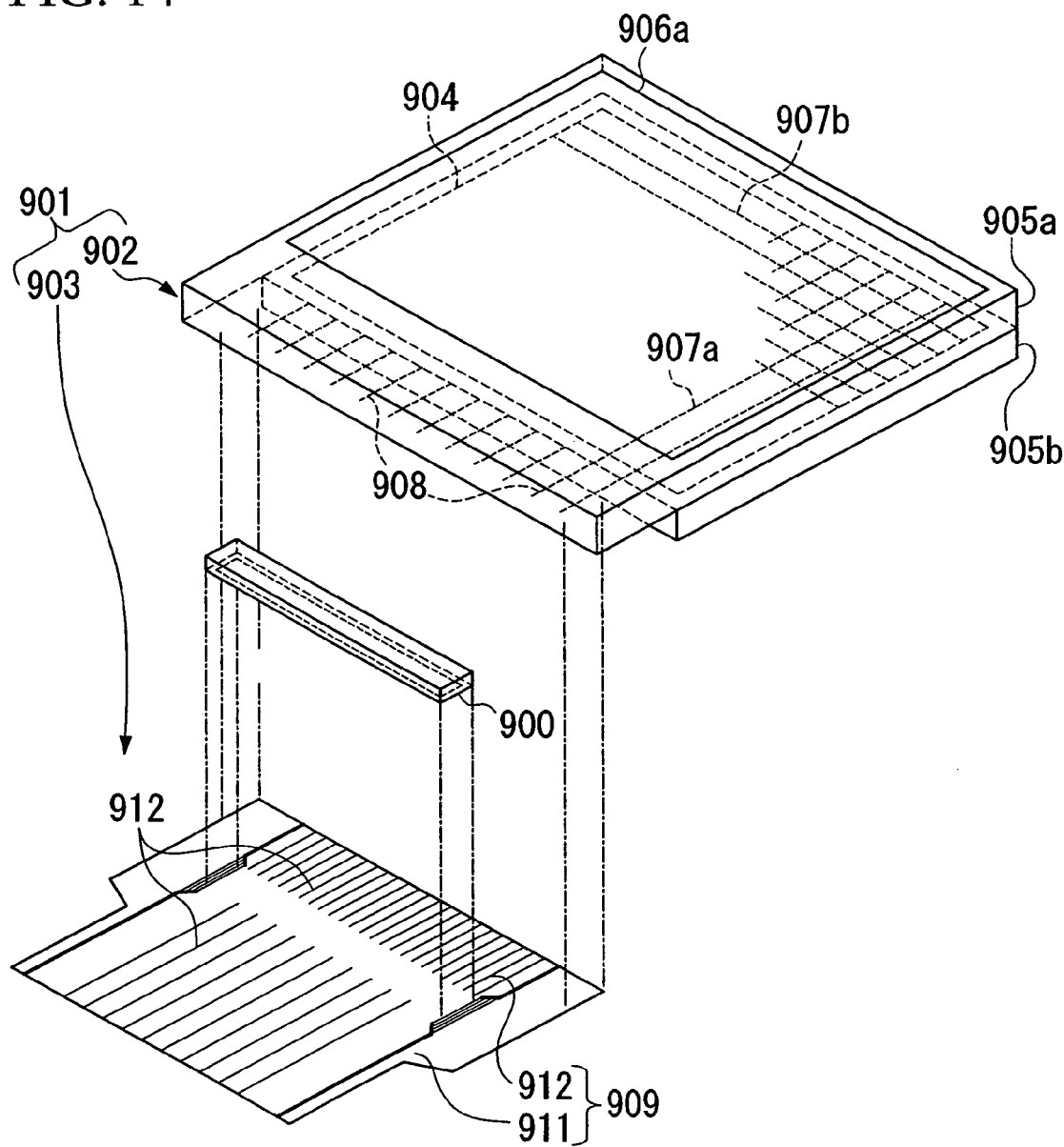
FIG. 14 shows another aspect of a liquid crystal display.

FIG. 14 shows another embodiment of a liquid crystal display.

The liquid crystal display (electro-optical apparatus) 901 shown in FIG. 14 comprises in general, a color liquid crystal panel (electro-optical panel) 902 and a circuit substrate 903 connected to the liquid crystal panel 902. Moreover, a lighting system such as a backlight or the like and other incidental equipment are attached to the liquid crystal panel 902 as required.

The liquid crystal panel 902 has a pair of substrates 905a and 905b adhered by a sealing material 904. In a space formed between these substrates 905a and 905b, being a so called cell gap, a liquid crystal is enclosed. These substrates 905a and 905b are generally formed from an optically transparent material, for example, a glass, plastics, or the like. On the outer surface of the substrates 905a and 905b, a polarizing plate 906a and another polarizing plate are adhered. In FIG. 14, the other polarizing plate is not shown.

Moreover electrodes 907a are formed on the inner surface of the substrate 905a and electrodes 907b are formed on the inner surface of the substrate 905b. These electrodes 907a and 907b are formed in stripes, letters, numeric characters, or other appropriate patterns. Moreover, these electrodes 907a and 907b are formed from an optically transparent material, for example such as ITO. The substrate 905a has a projecting section which projects from the substrate 905b. On this projecting section, a plurality of terminals 908 are formed. These terminals 908 are formed at the same time as when the electrodes 907a are formed on the substrate 905a. Therefore, these terminals 908 are formed from ITO for example. These terminals 908 include ones integrally extending from the electrodes 907a, and ones connected to the electrodes 907b via a conductive material (not shown).

On the circuit substrate 903, a semiconductor element 900 serving as a liquid crystal driving IC is mounted in a predetermined position on a wiring substrate 909. Although not shown, on a predetermined position of an other part except for the part mounted with the semiconductor element 900, a resistor, a capacitor, and other chip parts may be mounted. The wiring substrate 909 is manufactured by patterning a metal film such as Cu formed on a flexible film shaped base substrate 911 such as a polyimide or the like, to form a wiring pattern 912.

In the present embodiment, the electrodes 907a and 907b on the liquid crystal panel 902 and the wiring pattern 912 on the circuit substrate 903 are formed by the abovementioned method of manufacturing a device.

According to the liquid crystal display of the present embodiment, it becomes possible to obtain a high quality liquid crystal display which can be decreased in size and thickness, and in which defects such as disconnection rarely occur.

Seventh Embodiment

Next as a seventh embodiment, is a description of a plasma display device, which is another example of the electro-optical device of the present invention.

Figure 15:
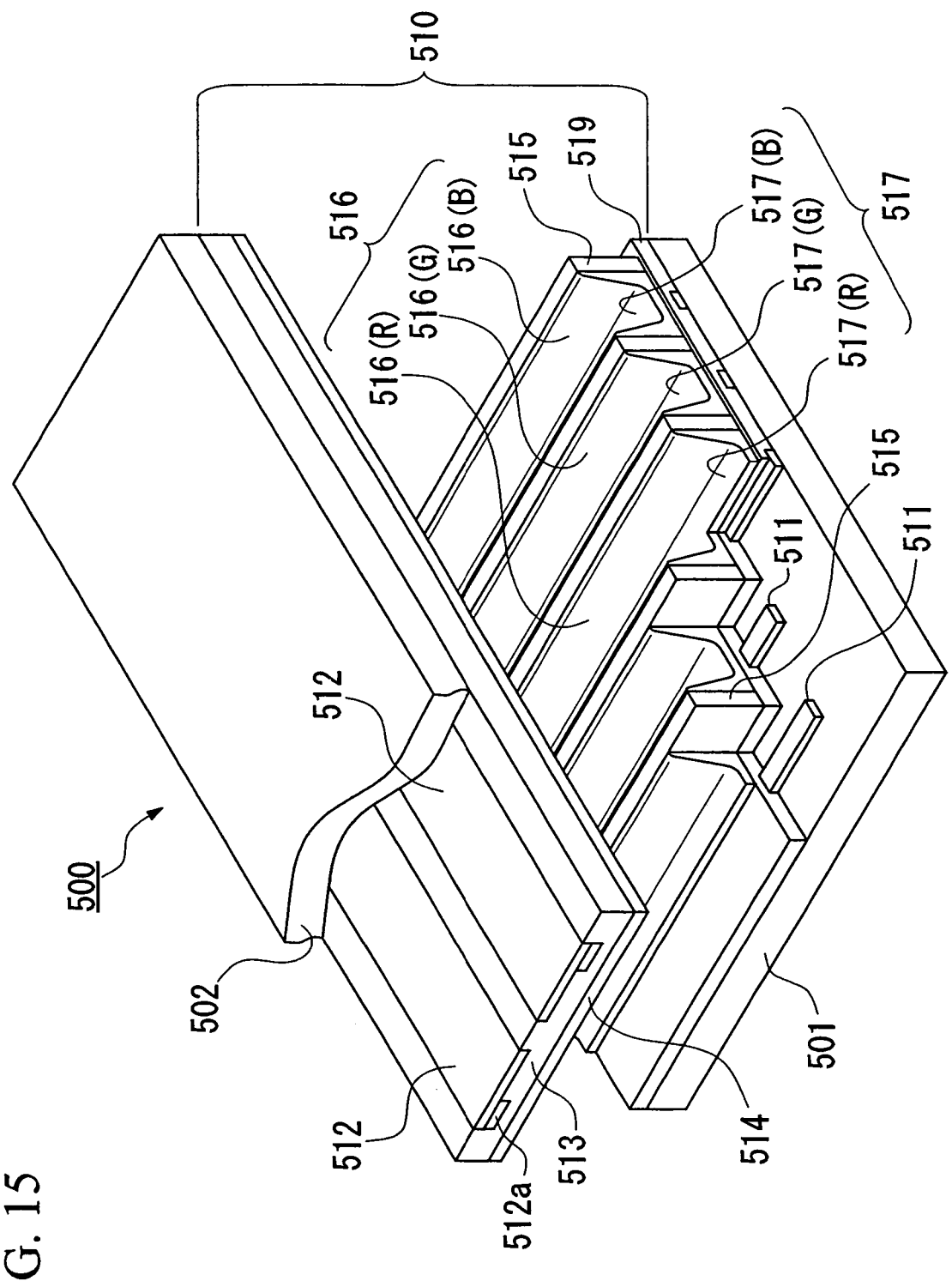
FIG. 15 is an exploded perspective view of a plasma display device.

FIG. 15 is an exploded perspective view of a plasma display device 500 of the present embodiment.

The plasma display device 500 includes substrates 501 and 502 arranged to oppose each other, and a discharge display section 510 formed between these substrates.

The discharge display section 510 includes a plurality of discharge chambers 516 assembled together. Of the plurality of discharge chambers 516, three discharge chambers 516, that is, a red discharge chamber 516 (R), a green discharge chamber 516 (G), and a blue discharge chamber 516 (B) are arranged as a set to constitute one pixel.

On the top face of the substrate 501, address electrodes 511 are formed in stripes at predetermined intervals, and a dielectric layer 519 is formed so as to cover the address electrodes 511 and the top face of the substrate 501. On the dielectric layer 519, a partition 515 is formed between the respective address electrodes 511 along the respective address electrodes 511. The partition 515 includes partitions adjacent on both sides in the width direction of the address electrode 511, and partitions extendingly provided in a direction orthogonal to the address electrode 511. Moreover, the discharge chambers 516 are formed corresponding to these rectangular regions separated by the partition 515.

Inside the rectangular region partitioned by the partition 515, a fluorescent substance 517 is arranged. The fluorescent substance 517 emits one of red, green and blue fluorescence. The red fluorescent substance 517 (R) is arranged at the base of the red discharge chamber 516 (R), the green fluorescent substance 517 (G) is arranged at the base of the green discharge chamber 516 (G), and the blue fluorescent substance 517 (B) is arranged at the base of the blue discharge chamber 516 (B) respectively.

On the other hand, a plurality of display electrodes 512 are formed in stripes at predetermined intervals in a direction orthogonal to the above address electrodes 511. Furthermore, a dielectric layer 513 and a protective film 514, made of MgO, are formed to cover them.

The substrate 501 and substrate 502 are opposingly adhered so that the address electrodes 511 and the display electrodes 512 are orthogonal to each other, The address electrodes 511 and display electrodes 512 are connected to an AC power supply (not shown). Power is supplied to the respective electrodes so that the fluorescent substances 517 are excited and emit light in the discharge display sections 510, enabling color display.

In the present embodiment, since the address electrodes 511 and the display electrodes 512 are respectively formed based on the abovementioned wiring pattern forming method, it becomes possible to obtain a high quality plasma display device which can be decreased in size and thickness, and in which defects such as disconnection rarely occur.

Eighth Embodiment

Next, as an eighth embodiment, an embodiment of a non-contact card medium is described.

Figure 16:
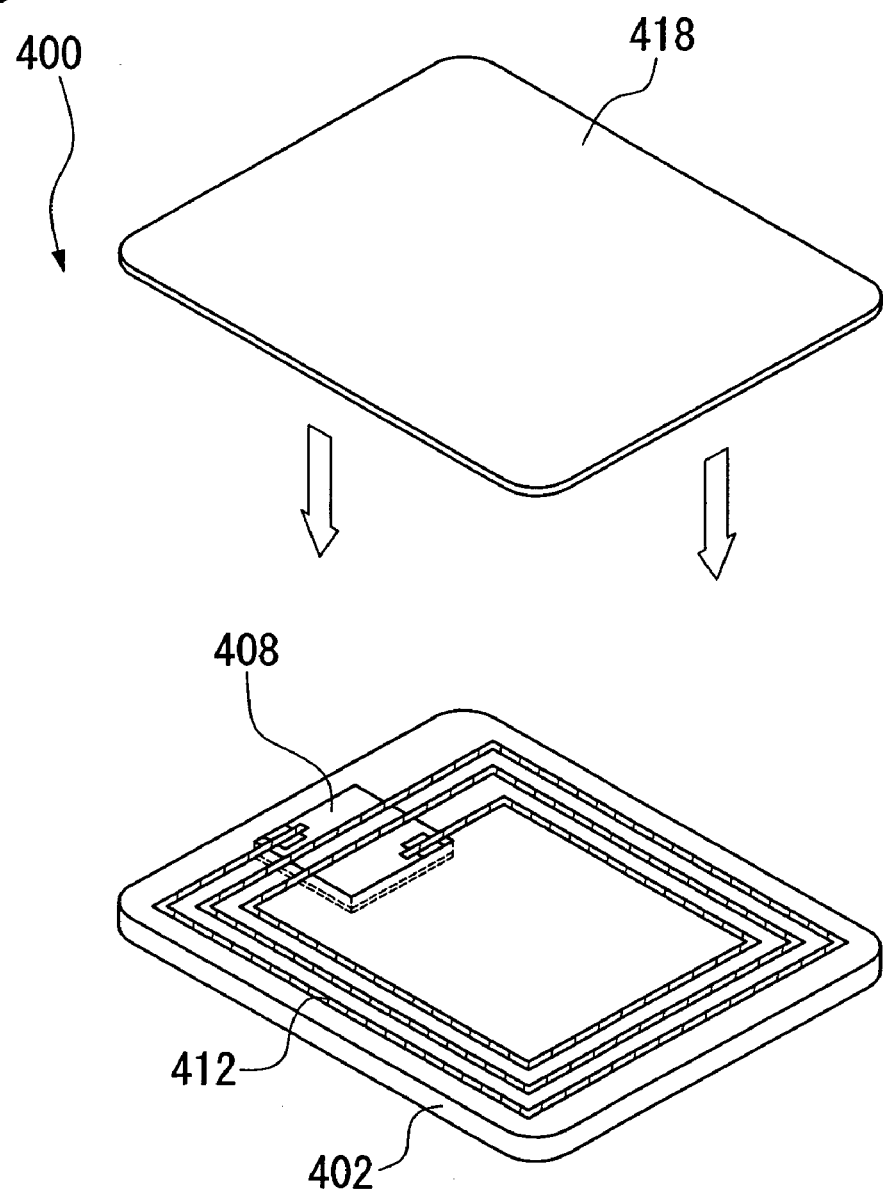
FIG. 16 is an exploded perspective view of a non-contact card medium.

As shown in FIG. 16, the non-contact card medium (electronic apparatus) 400 according to the present embodiment has a semiconductor integrated circuit chip 408 and an antenna circuit 412 built into a body comprised of a card body 402 and card cover 418, and performs at least one of power supply and data transfer with an external transmitter (not shown) by at least one of electromagnetic waves and electric capacitance coupling.

In the present embodiment, the antenna circuit 412 is formed by the wiring pattern forming method according to the abovementioned method.

According to the non-contact card medium of the present embodiment, it becomes possible to obtain a high quality non-contact card medium display device, which can be decreased in size, and in which defects such as disconnection rarely occur.

The device (electro-optical apparatus) according to the present invention is also applicable, in addition to the abovementioned devices, to a surface-conduction-type electron emission element or the like which utilizes a phenomenon where current flows in parallel with the surface of a small sized thin film formed on a substrate so as to cause electron emission.

Ninth Embodiment

Detailed examples of electronic apparatuses of the present invention are described as a ninth embodiment.

Figure 17A:
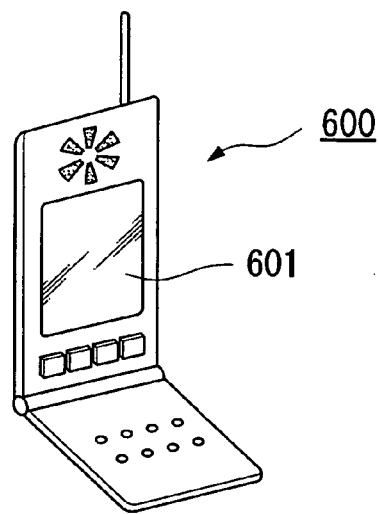
FIG. 17A to FIG. 17C show specific examples of electronic apparatus of the present invention.

FIG. 17A is a perspective view showing an example of a portable telephone. In FIG. 17A, reference symbol 600 denotes a portable telephone main unit, and reference symbol 601 denotes a liquid crystal display section comprising a liquid crystal display.

Figure 17B:
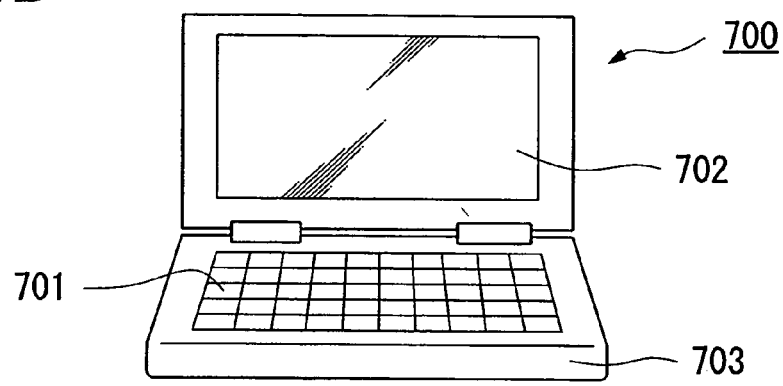

FIG. 17B is a perspective view showing an example of a portable information processing device, such as a word processor and personal computer. In FIG. 17B, reference symbol 700 denotes an information processing device, reference symbol 701 denotes an input section such as a keyboard, reference symbol 703 denotes an information processor main unit, and reference symbol 702 denotes a liquid crystal display section comprising the liquid crystal display of the above embodiment.

Figure 17C:
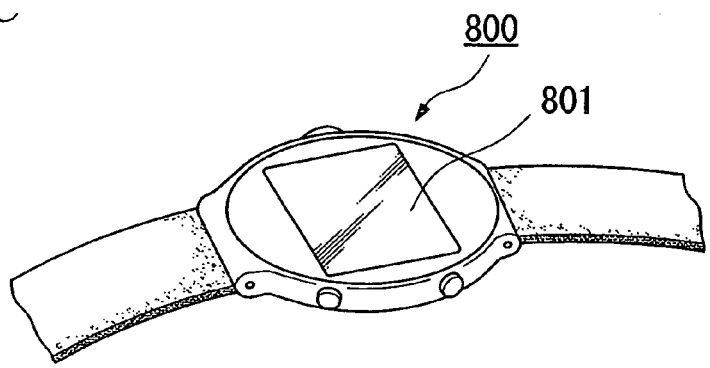

FIG. 17C is a perspective view showing an example of watch type electronic apparatus. In FIG. 17C, reference symbol 800 denotes a watch main unit, and reference symbol 801 denotes a liquid crystal display section comprising the liquid crystal display of the above embodiment.

Since the electronic apparatus shown in FIG. 17A to FIG. 17C include liquid crystal displays of the above embodiment, it becomes possible to decrease the size and thickness, and increase quality.

The electronic apparatus of the present embodiment comprise liquid crystal devices. However they may be electronic apparatus comprising another electro-optical apparatus such as an organic electroluminescence display device, a plasma display device, or the like.

As mentioned above, while preferred embodiments have been described and illustrated above, it should be understood that these are exemplary of the invention and are not to be considered as limiting. The forms and the combinations of respective components shown in the examples, are but one example and may be variously modified according to design requirement or the like, without departing from the spirit or scope of the present invention.

For example, plasma treatment was performed to make the banks repellent. However as described above, the construction may be such that the banks are formed from a material containing fluorine or a fluorine component. Moreover, the construction may be such that a treatment other than the plasma treatment is performed.

Furthermore, in the above embodiments, the construction was such that droplets having a diameter larger than the width of the ditch section were discharged. However the construction is not limited to this and may be such that the width of the ditch section is larger.

Moreover, in the above embodiments, the contact angle with respect to the coating region H1 on the substrate P was below 15°. However the angle is not limited to this and may be any angle as long as the difference between the contact angle with respect to the repellent region H2 and the contact angle with respect to the coating region H1 is above 40°.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of manufacturing an active matrix substrate, comprising:
   forming a coating region on a substrate;
   forming banks to enclose the coating region;
   subjecting the coating region and the banks to a resurfacing treatment; and
   discharging a single droplet of functional liquid onto the substrate so that the single discharged droplet flows into the coating region, the single discharged droplet having a height below a height of the banks and touching each wall of the banks when within the coating region, a width of the coating region between the banks being smaller than a diameter of a single discharged droplet of the functional liquid,
   a difference between a contact angle of the single discharged droplet of the functional liquid with respect to the coating region and a contact angle of the functional liquid with respect to the bank being above 40°, and
   the contact angle of the single discharged droplet of the functional liquid with respect to the coating region being below 15°.

2. The method according to claim 1, the method further comprising:
   subjecting the banks to surface reformation by a plasma treatment.

3. The method according to claim 1, the banks including fluorine or a fluorine component.

4. The method according to claim 1, the discharged functional liquid forming a wire pattern.

5. The method according to claim 1, the functional liquid containing conductive particles.

6. The method according to claim 1, further comprising:
   performing a heat treatment or an optical treatment on the functional liquid to make the functional liquid conductive.

7. The method according to claim 1, comprising:
   forming a gate wiring on the substrate;
   forming a gate insulating film on the gate wiring;
   laminating a semiconductor layer via the gate insulating film;
   forming a source electrode and a drain electrode on the gate insulating layer;
   arranging an insulating material on the source electrode and the drain electrode; and
   forming a pixel electrode on the arranged insulating material,
   at least one of the forming the gate wiring, the forming the source electrode and the forming the pixel electrode including the discharging the functional liquid onto the substrate.

8. The method according to claim 1, further comprising:
   performing a drying treatment after the discharging the single droplet of the functional liquid.

9. The method according to claim 8, the discharging the single droplet and the performing the drying treatment being repeatedly performed to form a specific thickness of the functional liquid.

* * * * *